US010983073B2

(12) United States Patent
Ogata et al.

(10) Patent No.: US 10,983,073 B2
(45) Date of Patent: Apr. 20, 2021

(54) HYBRID INSPECTION SYSTEM

(71) Applicant: Rigaku Corporation, Tokyo (JP)

(72) Inventors: Kiyoshi Ogata, Tokyo (JP); Kazuhiko Omote, Tokyo (JP); Yoshiyasu Ito, Tokyo (JP)

(73) Assignee: RIGAKU CORPORATION, Tokyo (JP)

( * ) Notice: Subject to any disclaimer, the term of this patent is extended or adjusted under 35 U.S.C. 154(b) by 0 days.

(21) Appl. No.: 16/205,832

(22) PCT Filed: Jul. 14, 2017

(86) PCT No.: PCT/JP2017/025676
§ 371 (c)(1),
(2) Date: Nov. 30, 2018

(87) PCT Pub. No.: WO2018/016430
PCT Pub. Date: Jan. 25, 2018

(65) Prior Publication Data
US 2019/0227006 A1 Jul. 25, 2019

(30) Foreign Application Priority Data
Jul. 16, 2016 (JP) .............................. JP2016-140944

(51) Int. Cl.
*G01N 23/00* (2006.01)
*G01N 23/20025* (2018.01)
(Continued)

(52) U.S. Cl.
CPC ..... *G01N 23/20025* (2013.01); *G01N 23/201* (2013.01); *G01N 23/203* (2013.01);
(Continued)

(58) Field of Classification Search
CPC ....... G01N 23/20025; G01N 23/20016; G01N 23/203; G01N 23/201; G01N 2223/045;
(Continued)

(56) References Cited

U.S. PATENT DOCUMENTS

| 10,209,206 B2 * | 2/2019 | Barak ................... G01N 23/20 |
| 2010/0002833 A1 * | 1/2010 | Matoba ................ G01N 23/223 378/44 |

(Continued)

FOREIGN PATENT DOCUMENTS

| CN | 205015299 U | 2/2016 |
| JP | 2010261737 A | 11/2010 |

(Continued)

OTHER PUBLICATIONS

Bo Su, et al., "Metrology Applications in IC Manufacturing; Chapter 8 Limitations of Metrology Techniques and Hybrid Metrology," SPIE, p. 131-139, Sep. 25, 2015.

(Continued)

*Primary Examiner* — Dani Fox
(74) *Attorney, Agent, or Firm* — Westerman, Hattori, Daniels & Adrian, LLP

(57) ABSTRACT

A hybrid inspection system of the present invention is an inspection system including a first inspection device (1) for inspecting a sample (11) based on X-ray measurement data obtained by irradiating the sample (11) with X-rays, and a second inspection device (2) for inspecting the sample (11) by a measuring method using no X-rays. The X-ray measurement data obtained by the first inspection device or an analysis result of the X-ray measurement data is output to the second inspection device (2). In the second inspection device (2), the structure of the sample (11) is analyzed by (Continued)

using the X-ray measurement data input from the first inspection device (1) or the analysis result of the X-ray measurement data.

18 Claims, 18 Drawing Sheets

(51) Int. Cl.
G01N 23/201 (2018.01)
G01N 23/203 (2006.01)
G01N 23/20016 (2018.01)

(52) U.S. Cl.
CPC . G01N 23/20016 (2013.01); *G01N 2223/045* (2013.01); *G01N 2223/05* (2013.01); *G01N 2223/304* (2013.01); *G01N 2223/321* (2013.01); *G01N 2223/6116* (2013.01)

(58) Field of Classification Search
CPC ......... G01N 2223/05; G01N 2223/304; G01N 2223/321; G01N 2223/6116; G01N 23/20
USPC .......................................................... 378/86
See application file for complete search history.

(56) References Cited

U.S. PATENT DOCUMENTS

| | | | |
|---|---|---|---|
| 2010/0271621 A1* | 10/2010 | Levy | G01N 21/47 356/73 |
| 2011/0135062 A1* | 6/2011 | Ishibashi | G01B 15/04 378/89 |
| 2011/0222656 A1* | 9/2011 | Matoba | G01N 23/083 378/62 |
| 2012/0051518 A1 | 3/2012 | Omote et al. | |
| 2012/0087473 A1* | 4/2012 | Omote | G01B 15/04 378/86 |
| 2013/0039460 A1* | 2/2013 | Levy | G03F 7/70658 378/44 |
| 2013/0304424 A1* | 11/2013 | Bakeman | G01N 21/84 702/189 |
| 2014/0067316 A1* | 3/2014 | Ishibashi | G06F 17/00 702/150 |
| 2014/0204194 A1* | 7/2014 | Otani | G01N 21/47 348/79 |
| 2015/0117610 A1 | 4/2015 | Veldman et al. | |
| 2015/0287570 A1* | 10/2015 | Hayashi | H01J 37/185 250/310 |
| 2015/0369759 A1* | 12/2015 | Mazor | G01N 23/201 378/89 |
| 2015/0371910 A1* | 12/2015 | Goodwin | G01N 21/95 438/7 |
| 2016/0139065 A1* | 5/2016 | Barak | G01N 23/20 378/72 |
| 2016/0356729 A1* | 12/2016 | Bauer | H01J 37/2955 |
| 2017/0194126 A1* | 7/2017 | Bhaskar | H01J 37/28 |
| 2017/0234814 A1* | 8/2017 | Ogata | G01N 23/223 378/44 |
| 2017/0299528 A1* | 10/2017 | Ogata | G01N 23/223 |

FOREIGN PATENT DOCUMENTS

| | | |
|---|---|---|
| JP | 2011117894 A | 6/2011 |
| JP | 2012154895 A | 8/2012 |
| JP | 2012237566 A | 12/2012 |
| JP | 5700685 | 4/2015 |
| WO | WO2010/119844 A1 | 10/2010 |
| WO | WO2015/066040 A1 | 5/2015 |
| WO | WO2016/059672 A1 | 4/2016 |

OTHER PUBLICATIONS

Office Action dated Nov. 12, 2020, issued in counterpart CN application No. 201780042408.7, with English translation. (20 pages).

* cited by examiner

OUTLINE OF PATTERN SHAPE

FITTING OF OBSERVATION IMAGE OF CD-SEM BY SHAPE MODEL OF CD-SAXS

HYBRID INSPECTION SYSTEM

CROSS-REFERENCE TO RELATED APPLICATION

This application is a continuation of PCT/JP2017/025676 filed Jul. 14, 2017 which claims priority to Japanese Patent Application JP 2016-140944 filed on Jul. 16, 2016, the entire contents of both applications are hereby incorporated by reference in their entirety.

TECHNICAL FIELD

The present invention relates to a hybrid inspection system suitable for a semiconductor manufacturing field, etc. such as a technical field for manufacturing a device having a multilayer structure in which a large number of thin films are laminated on a substrate.

BACKGROUND ART

The shape of an electronic element such as semiconductor or the like which is manufactured by laminating multiple thin films on a substrate according to a lithography technique varies depending on states such as the film thickness, density, crystallinity, etc. of a thin film to be formed, and a lithography processing condition. Therefore, an inspection device capable of accurately measuring the shape of a processed element has been needed. The shape of this type of processed element is called as CD (Critical Dimension) as an important numerical value to be managed in a semiconductor process.

A transmission electron microscope (TEM) and a scanning electron microscope (SEM) are known as an inspection device for observing the shape of an element as described above by preparing a sliced sample. However, since these inspection devices destroy the sample, there are disadvantages that the sample cannot be measured on an in-line basis during a semiconductor manufacturing process, total inspection cannot be performed, a measurement result cannot be fed back to a previous step, the measurement result cannot be fed forward to a subsequent step, etc.

On the other hand, an inspection device using a scanning electron microscope (CD-SEM: Critical Dimension-Scanning Electron Microscope), an inspection device using an optical method (OCD: Optical Critical Dimension), an inspection device using an atomic force microscope (CD-AFM: Critical Dimension Atomic Force Microscope) and the like have been proposed as inspection devices for non-destructively measuring the shapes of elements as described above on an in-line basis during a semiconductor manufacturing process.

Furthermore, an X-ray nano shape measuring apparatus (CD-SAXS: Critical Dimension Small Angle X-ray Scattering) using X-ray small angle scattering has been proposed as an inspection device for accurately determining a repeated pattern shape using X-rays. For example, Patent Documents 1 and 2 disclose prior arts of CD-SAXS.

PRIOR ART DOCUMENTS

Patent Documents

Patent Document 1: Japanese Patent No. 5700685
Patent Document 2: Japanese Patent No. 5237186

Non-Patent Document

Non-Patent Document 1: Introduction to Metrology Applications in IC Manufacturing, P131, Tutorial Texts in Optical Engineering Volume TT101, SPIE PRESS, ISBN: 9781628418118

DISCLOSURE OF THE INVENTION

Problem to be Solved by the Invention

Since OCD described above uses light for a probe, it has advantages such as a small measurement area and a fast throughput, and further is characterized by being capable of analyzing a complex three-dimensional structure of a semiconductor device by using modeling and simulation. Therefore, OCD is effective as an inspection device for performing measurement on an in-line basis in a semiconductor manufacturing process. Furthermore, CD-SEM is effective as an inspection device for directly observing the surface shape of a device by using the principle of a scanning electron microscope. However, these inspection devices have limitations in resolution in a scale of a pitch of 10 nm or less, and analysis has been more difficult as miniaturization of semiconductor elements is promoted.

CD-SAXS is effective as an inspection device for analyzing the nanometer-scale shape of the surface of an electronic device. However, in order to measure a test pattern of 100 micrometers or less on the surface of a semiconductor wafer, a powerful X-ray source is necessary, but a compact high-brilliant X-ray source suitable for a semiconductor in-line inspection device has not been obtained.

The present invention has been made in view of the circumstances of these prior arts, and it is an object of the present invention to provide a hybrid inspection system suitable for analysis of the shape of an element having a multilayer structure in which a large number of thin films are laminated on a substrate, such as a semiconductor element.

Means of Solving the Problem

The basic concept of this type of hybrid inspection system is disclosed in Non-Patent Document 1, and the present invention is embodied based on such a basic concept.

That is, according to the present invention, a hybrid inspection system includes a first inspection device for inspecting a sample based on X-ray measurement data obtained by irradiating the sample with X-rays, and a second inspection device for inspecting the sample by a measuring method using no X-rays, wherein one of the X-ray measurement data obtained by the first inspection device and an analysis result of the X-ray measurement data is output to the second inspection device, and the second inspection device inspects the sample by using one of the X-ray measurement data obtained by the first inspection device and the analysis result of the X-ray measurement data.

Here, the first inspection device may be configured to include:
a measuring unit for irradiating a surface of the sample with X-rays and measuring scattering intensity;
a fitting unit for assuming a sample model having a microstructure on the surface of the sample, the microstructure forming a plurality of layers having different refractive indexes in a direction vertical to the surface, and constituting a periodic structure in which a unit structure is periodically arranged in a direction parallel to the surface in the plurality of layers, calculating scattering intensity of X-rays scattered by the microstructure in consideration of effects of refraction and reflection caused by the plurality of layers formed in the sample model, and fitting the X-ray scattering intensity calculated based on the sample model to the measured scattering intensity;

a determining unit for determining optimum values of parameters for specifying a shape of the unit structure based on a fitting result of the fitting unit; and an output unit for outputting, as an output value, at least a part of an analysis value containing the optimum values of the parameters for specifying the shape of the unit structure to the second inspection device according to a predetermined protocol, and the second inspection device may be configured to inspect the sample by using the output value from the first inspection device.

Furthermore, the first inspection device may be configured to include:

a measuring unit for irradiating a surface of the sample with X-rays and measuring scattering intensity;

a fitting unit for assuming a sample model having a microstructure on the surface, the microstructure forming one or a plurality of layers in a direction vertical to the surface and constituting a periodic structure in which a unit structure is periodically arranged in a direction parallel to the surface in the plurality of layers, the unit structure has a positional fluctuation from, a strict periodical position thereof, and the positional fluctuation is random without being dependent on a mutual positional difference, the unit structure being formed by a uniform real region and a spatial region in the layers, calculating scattering intensity of X-rays generated by the real region, and fitting the X-ray scattering intensity calculated based on the sample model to the measured scattering intensity;

a determining unit for determining optimum values of parameters for specifying a shape of the unit structure based on a fitting result of the fitting unit; and an output unit for outputting, as an output value, at least a part of an analysis value containing the optimum values of the parameters for specifying the shape of the unit structure to the second inspection device according to a predetermined protocol, and the second inspection device may be configured to inspect the sample by using the output value from the first inspection device.

Here, the "positional fluctuation" means a deviation (fluctuation) from a position at which the unit structure should be originally located (strict period position). Furthermore, the "real region" means a region where a substance (basically, a solid) exists in the unit structure. On the other hand, the "spatial region" means a region where no substance (basically, no solid) exists in the unit structure. It is to be noted that gas also exists in the spatial region.

Furthermore, according to the present invention, a hybrid inspection system including a first inspection device for inspecting a sample based on X-ray measurement data obtained by irradiating the sample with X-rays, and a second inspection device for inspecting the sample by a measuring method using no X-rays may be configured so that one of measurement data obtained by the second inspection device and an analysis result of the measurement data is output to the first inspection device, and the first inspection device inspects the sample by using one of the measurement data obtained by the second inspection device and the analysis result of the measurement data.

Furthermore, according to the present invention, a hybrid inspection system including a first inspection device for inspecting a sample based on X-ray measurement data obtained by irradiating the sample with X-rays, and a second inspection device for inspecting the sample by a measuring method using no X-rays may be configured so that the first inspection device includes:

a measuring unit for irradiating a surface of the sample with X-rays and measuring scattering intensity;

a fitting unit for assuming a sample model having a microstructure on the surface of the sample, the microstructure forming a plurality of layers having different refractive indexes in a direction vertical to the surface, and constituting a periodic structure in which a unit structure is periodically arranged in a direction parallel to the surface in the plurality of layers, calculating scattering intensity of X-rays scattered by the microstructure in consideration of effects of refraction and reflection caused by the plurality of layers formed in the sample model, and fitting the X-ray scattering intensity calculated based on the sample model to the measured scattering intensity;

a determining unit for determining optimum values of parameters for specifying a shape of the unit structure based on a fitting result of the fitting unit; and an output unit for outputting, as an output value, at least a part of an analysis value containing the optimum values of the parameters for specifying the shape of the unit structure according to a predetermined protocol, and a structure of the sample is analyzed by using one of X-ray measurement data obtained by the first inspection device and an analysis result of the X-ray measurement data, and one of data obtained by the second inspection device and an analysis result of the data.

Still furthermore, according to the present invention, a hybrid inspection system including a first inspection device for inspecting a sample based on X-ray measurement data obtained by irradiating the sample with X-rays, and a second inspection device for inspecting the sample by a measuring method using no X-rays may be configured so that the first inspection device includes:

a measuring unit for irradiating a surface of the sample with X-rays and measuring scattering intensity;

a fitting unit for assuming a sample model having a microstructure on the surface of the sample, wherein the microstructure forms one or a plurality of layers in a direction vertical to the surface and constitutes a periodic structure in which a unit structure is periodically arranged in a direction parallel to the surface in the layers, the unit structure has a positional fluctuation from a strict periodical position thereof, and the positional fluctuation is random without being dependent on a mutual positional difference, the unit structure being formed by a uniform real region and a spatial region in the layers, calculating scattering intensity of X-rays generated by the real region, and fitting the X-ray scattering intensity calculated based on the sample model to the measured scattering intensity;

a determining unit for determining optimum values of parameters for specifying a shape of the unit structure based on a fitting result of the fitting unit; and an output unit for outputting, at least a part of an analysis value containing the optimum values of the parameters for specifying the shape of the unit structure according to a predetermined protocol, and wherein a structure of the sample is analyzed by using one of X-ray measurement data obtained by the first inspection device and an analysis result of the X-ray measurement data, and one of data obtained by the second inspection device and an analysis result of the data.

In the present invention having the aforementioned configuration, the first inspection device includes:
- a sample stage for placing a sample as an inspection target thereon;
- an image observing unit for observing an image of the sample placed on the sample stage;
- a positioning mechanism that is controlled based on an image observation result of the sample by the image observing unit, and moves the sample stage in two orthogonal directions on a horizontal plane, a height direction and an in-plane rotation direction;
- a goniometer containing first and second rotation members each of which rotates independently along a virtual plane vertical to a surface of the sample placed on the sample stage around a rotation axis contained in the same plane as the surface of the sample;
- an X-ray irradiation unit that is installed in the first rotation member, and focuses and irradiates characteristic X-rays to an inspection position set on the same plane as the surface of the sample placed on the sample stage;
- an X-ray detector installed in the second rotation member; and
- an analysis unit for quantizing and analyzing an X-ray pattern detected by the X-ray detector.

Here, the first inspection device may be configured to measure X-rays transmitted through the sample by the X-ray detector, or may be configured to measure scattered X-rays from the surface of the sample by the X-ray detector.

Specifically, as the first inspection device may be used a transmission type small angle X-ray scatter ng device (T-SAXS: Transmission-Small Angle X-ray Scattering) for measuring transmitted X-rays, or a reflection type small angle X-ray scattering device (GI-SAXS: Glazing Incidence-Small Angle X-ray Scattering) for making X-rays incident to a sample surface at a glazing angle and measuring scattered X-rays from the surface.

GI-SAXS is suitable for, for example, measurement of a line-and-space structure having a depth of 200 nm or less, a hole and a protrusion, and T-SAXS is suitable for measurement of a structure of a depth of 200 nm or more, for example, a hole diameter of a hole structure. The first inspection device may be configured as a device capable of measuring both T-SAXS and GI-SAXS.

Furthermore, the first inspection device may be configured to include a two-dimensional X-ray detector as the X-ray detector. As a result, it is possible to perform rapid measurement.

The second inspection device may comprise an optical inspection device (OCD). Furthermore, as the second inspection device may be used a device using another method such as an inspection device using a scanning electron microscope (CD-SEM), or an inspection device using an atomic force microscope (CD-AFM).

A pitch of the periodic structure in the sample model may be contained as the analysis value output from the first inspection device.

More specifically, various parameters are possible as information (analysis value) to be transferred from the first inspection device to the second inspection device according to the shape of the surface. However, in the line-and-space structure, pitch, minimum line width (CD; Critical Dimension) height, sidewall angle (Side-Wall Angle), roundness (Roundness), etc. are provided, and variation information of each parameter is also contained.

Furthermore, when the periodic structure in the sample model includes a hole repeating structure, the hole diameter may be contained as the analysis value output from the first inspection device.

As described above, according to the hybrid inspection system of the present invention, the element shape of a multilayer structure in which multiple thin films are laminated on a substrate such as a semiconductor element can be analyzed with high precision and multifaceted.

Figure 16A:
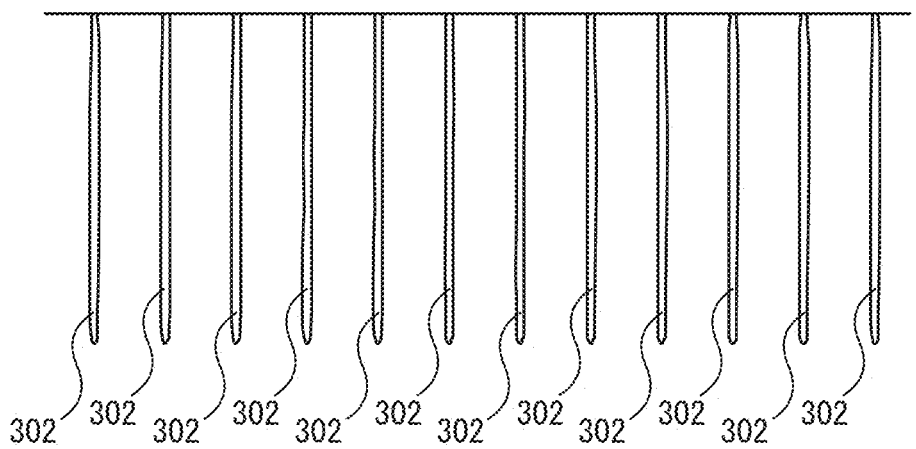
FIG. 16A is a schematic cross-sectional view of a deep-hole repetitive structure as an inspection target, and FIG.

16B is an enlarged view of one deep hole in the schematic cross-sectional view shown in FIG. 16A.

Figure 17:
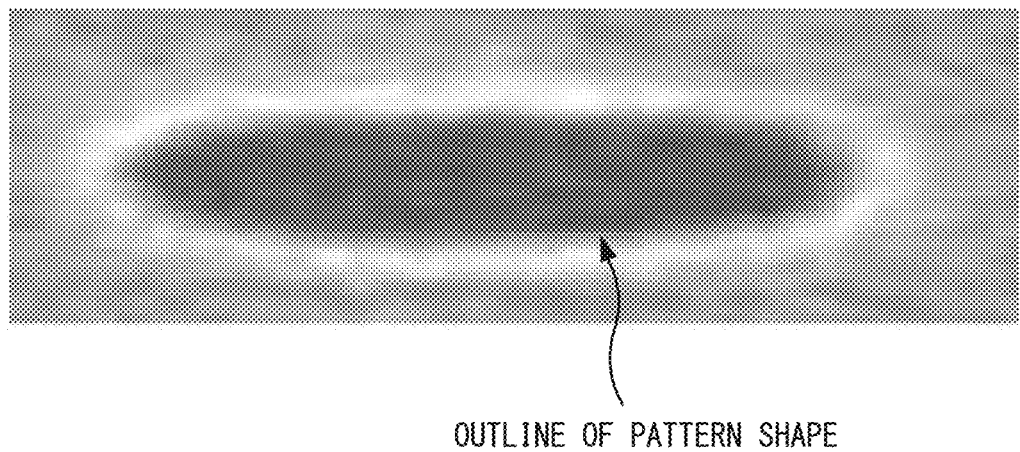

FIG. 17 is a diagram showing an example of measurement data by CD-SEM (second inspection device).

Figure 18:
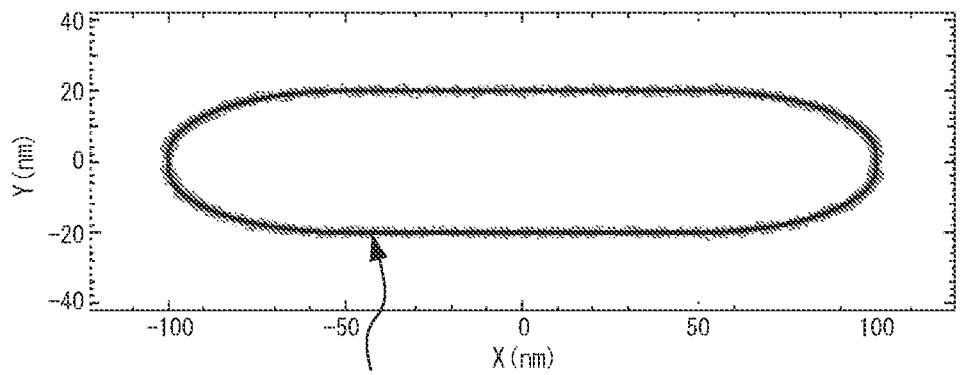
Figure 18:
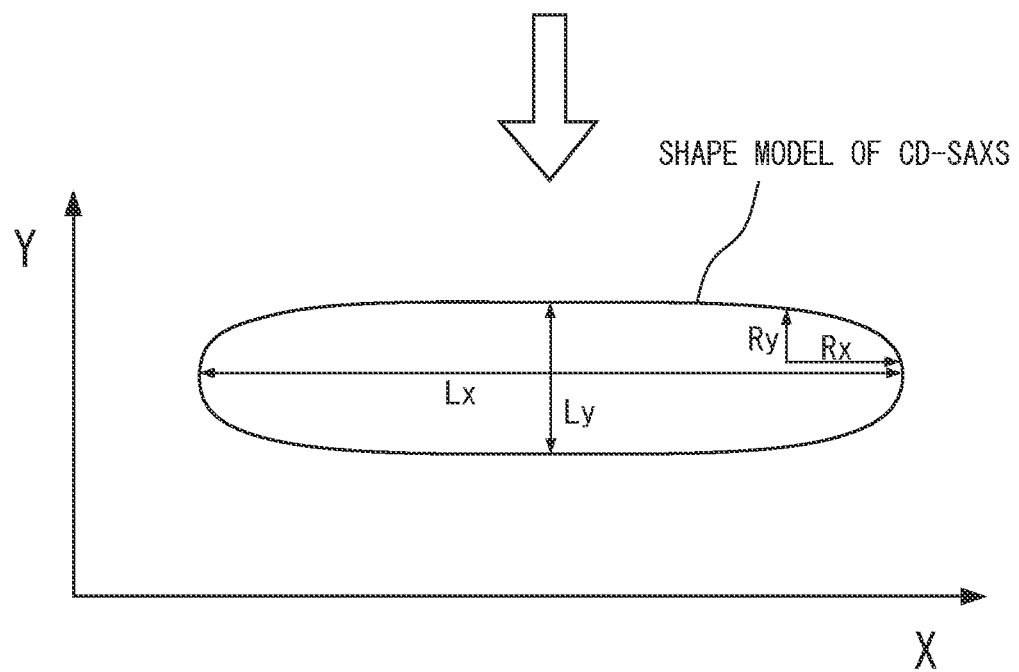

FIG. 18 is a diagram showing a usage example in which an observation image of CD-SEM (second inspection device) is fitted with a shape model of CD-SAXS (first inspection device).

DESCRIPTION OF REFERENCE SIGNS

10: sample stage, 11: sample, 20: positioning mechanism, 30: goniometer, 31: goniometer main body; 32: first rotation arm; 33: second rotation arm; 40: an X-ray irradiation unit; 41: an X-ray tube; 42: first X-ray optical element, 43: second X-ray optical element, 44: focusing slit, 45: unit main body, 47: incident X-ray, 48: scatter X-rays, 49: transmitted X-ray, 50: X-ray detector, 60: optical microscope, 100: central processing unit, 101: XG controller, 102: image recognition circuit, 103: focus controller, 104: positioning controller, 106: goniometer controller, 107: counting control circuit, 110: storage unit, 201: operating unit, 202: display unit, 203: communication unit, 300: line, 301: space, 302: deep hole

BEST MODES FOR CARRYING OUT THE INVENTION

An embodiment of the present invention will be described hereunder in detail with reference to the drawings.
[Basic Configuration Examples and Information Transmission System]

FIG. 1 to 5 are block diagrams schematically showing basic configuration examples and information transmission systems of a hybrid inspection system according to an embodiment of the present invention.

The hybrid inspection system according to the present embodiment includes a first inspection device 1 for inspecting a sample based on X-ray measurement data obtained by irradiating the sample with X-rays, and a second inspection device 2 for inspecting the sample by a measuring method using no X-rays.

For example, an X-ray nano shape measuring device (CD-SAXS) is applied as the first inspection device 1. Furthermore, for example, an optical inspection device (OCD) or an inspection device using a scanning electron microscope (CD-SEM) is applied as the second inspection device 2.

Figure 1:
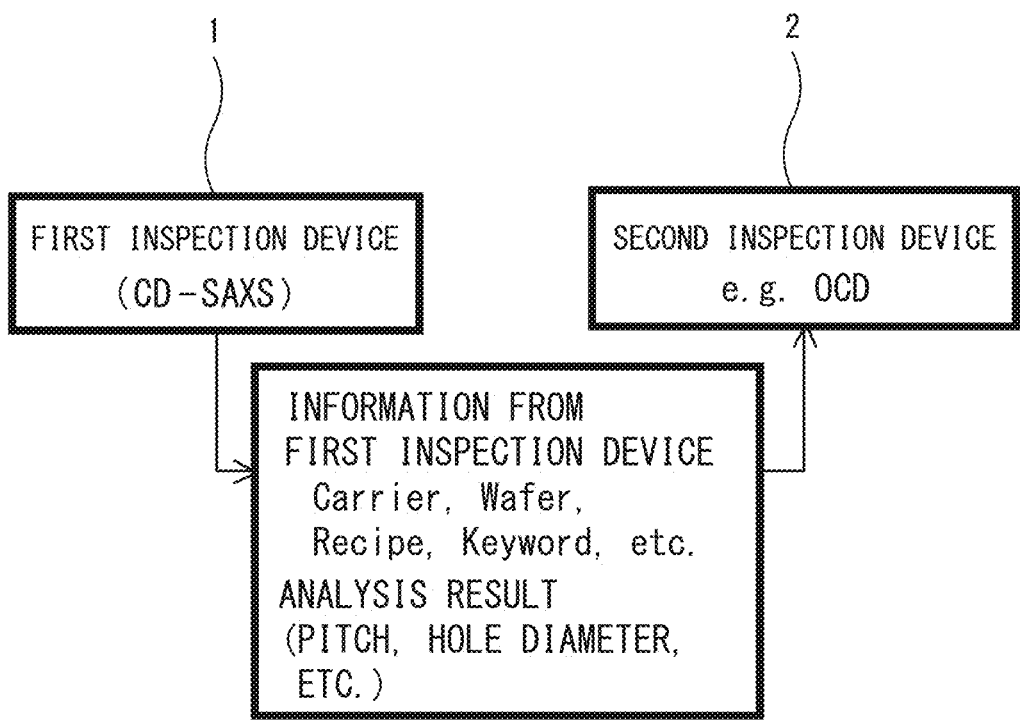
FIG. 1 is a block diagram schematically showing a first basic configuration example and an information transmission system of a hybrid inspection system according to an embodiment of the present invention.
Figure 2:
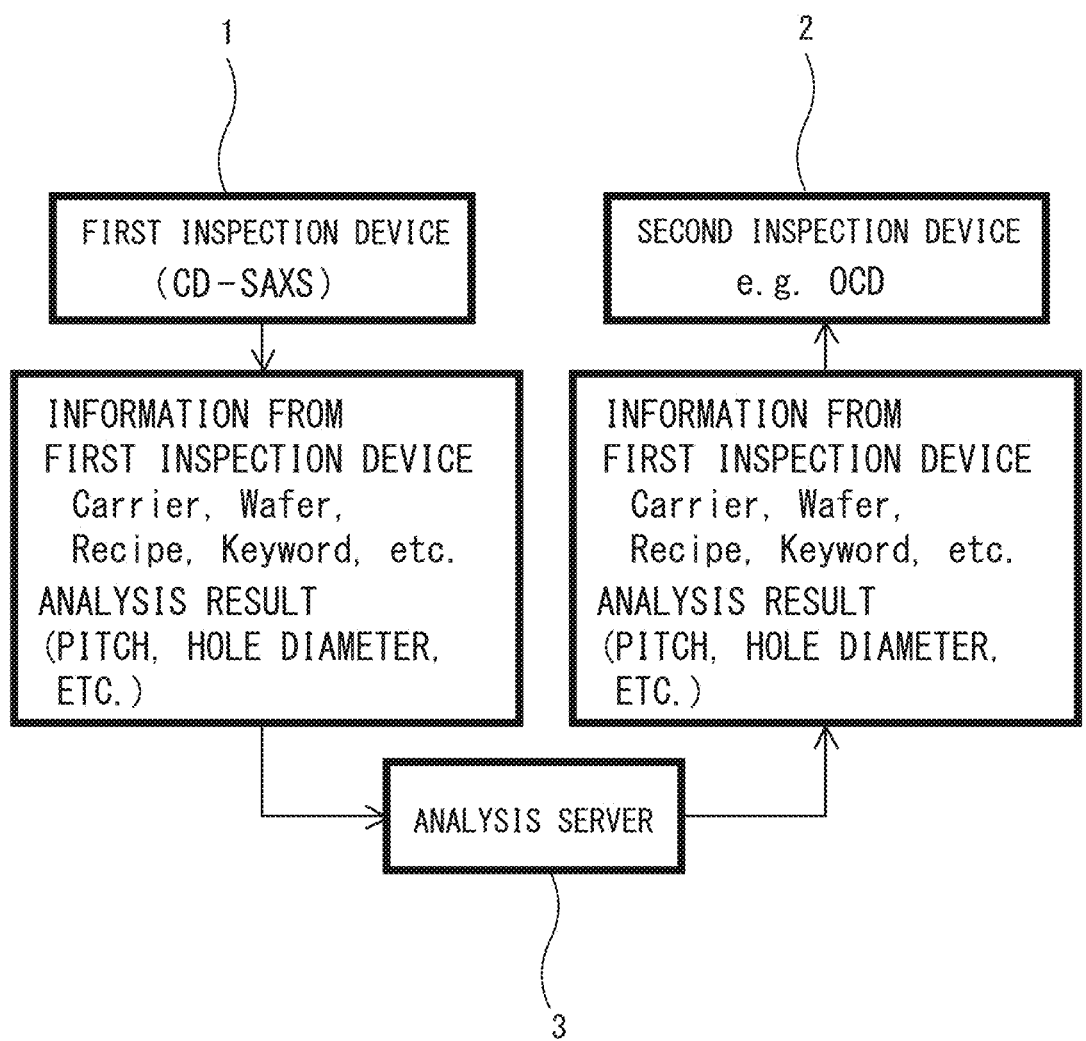
FIG. 2 is a block diagram schematically showing a second basic configuration example and an information transmission system of the hybrid inspection system according to the embodiment of the present invention.
Figure 3:
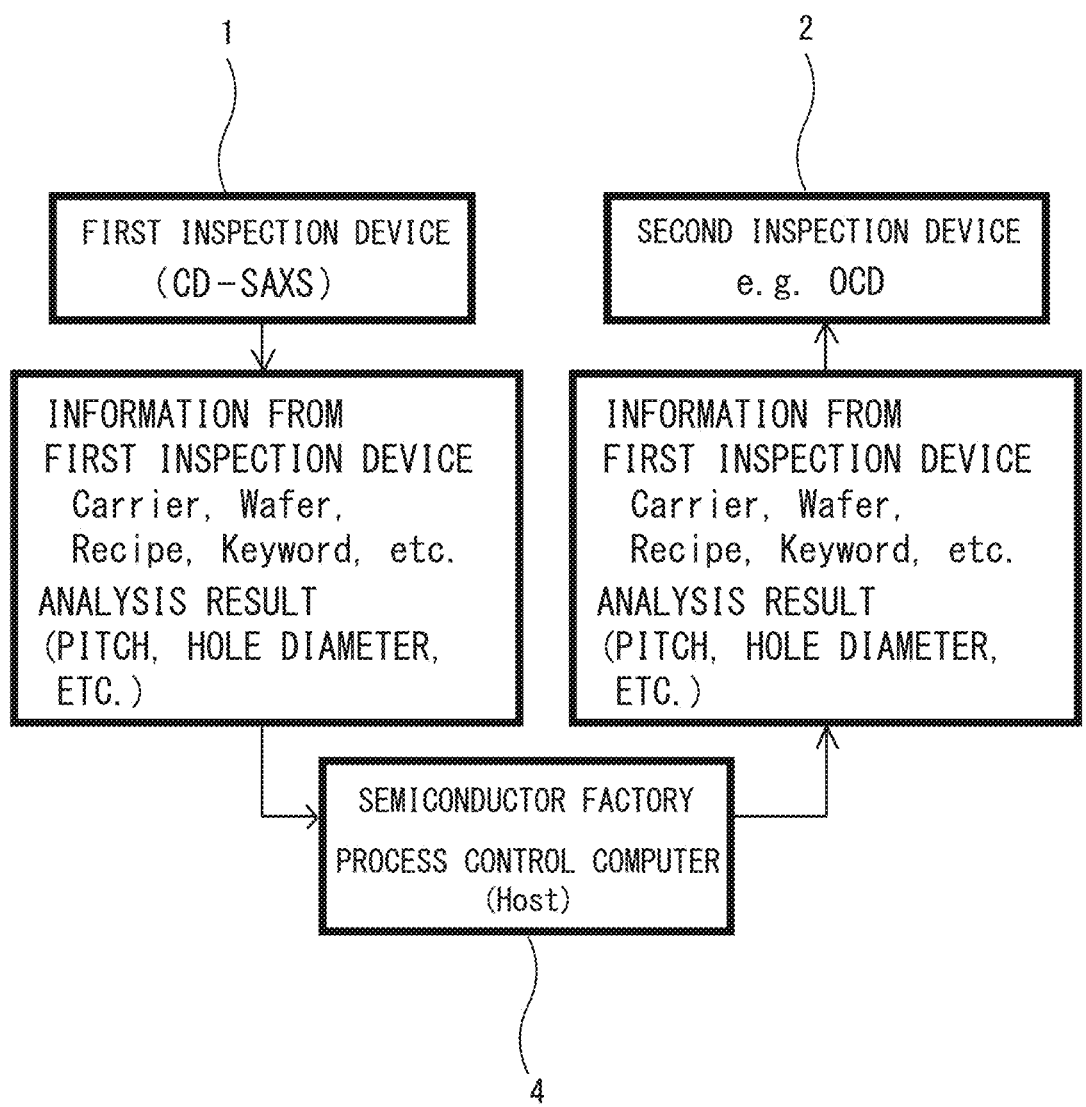
FIG. 3 is a block diagram schematically showing a third basic configuration example and an information transmission system of the hybrid inspection system according to the embodiment of the present invention.

In first to third basic configuration examples shown in FIGS. 1 to 3, information from the first inspection device 1 is output to the second inspection device 2. The information output from the first inspection device 1 contains, for example, information on a sample as a measurement target (Carrier, Wafer Information) and the like as well as measurement data obtained by performing an X-ray measurement on a sample and an analysis result of the X-ray measurement data.

Transmission of the analysis result obtained by the first inspection device 1 and the sample information (Carrier, Wafer information) to the second inspection device 2 makes it possible to perform high-precision analysis in the second inspection device 2.

That is, since OCD constituting the second inspection device 2 uses light for a probe, OCD has advantages such as a small measurement area, a fast throughput etc., and furthermore is characterized by being capable or analyzing a complex three-dimensional structure of a semiconductor or device by using modeling and simulation, so that OCD is effective as an inspection device for performing measurement on an in-line basis in a semiconductor manufacturing process.

However, OCD has a limitation in resolution in a scale of a pitch of 10 nm or less, and thus analysis has been more difficult as miniaturization of semiconductor elements is prompted.

On the other hand, CD-SAXS constituting the first inspection device 1 is effective as an inspection device for analyzing a nanometer-scale surface shape of an electronic device. Moreover, according to a configuration having an X-ray irradiation unit described later, it is possible to acquire a compact high-brilliant X-ray source having sufficiently strong power to measure a test pattern of 100 micrometers or less on the surface of a semiconductor wafer. Therefore, high-precision analysis can be performed in the second inspection device 2 by using information output from the first inspection device 1.

Here, in the first basic configuration example shown in FIG. 1, the first inspection device 1 and the second inspection device 2 are directly connected to each other to transmit information. In this case, Ethernet (registered trademark) is used as connecting means, but any transmission method such as serial transmission such as RS-232C, optical transmission or radio transmission may be used.

In the second basic configuration example shown in FIG. 2, the first inspection device 1 and the second inspection device 2 are connected to each other via an analysis server 3. In this basic configuration example, a result of the first inspection device 1 is transmitted to the analysis server 3. The second inspection device 2 obtains information from the analysis server 3. In this case, Ethernet (registered trademark) is also used as the connecting means, but any transmission method such as the serial transmission such as RS-232C, the optical transmission, or the radio transmission may be used.

In the third basic configuration example shown in FIG. 3, the first inspection device 1 and the second inspection device 2 are connected to each other via a host computer 4 (Host) that takes charge of controlling the process in a semiconductor factory. In this basic configuration example, a result of the first inspection device 1 is transmitted to the host computer 4, and the second inspection device 2 obtains information from the host computer 4. In a semiconductor manufacturing factory that normally uses 300 mm wafers, information is transmitted according to a standardization protocol called as GEM300. Information transmission of the first and second inspection devices 1 and 2 is enabled by programming the host computer 4.

Figure 4:
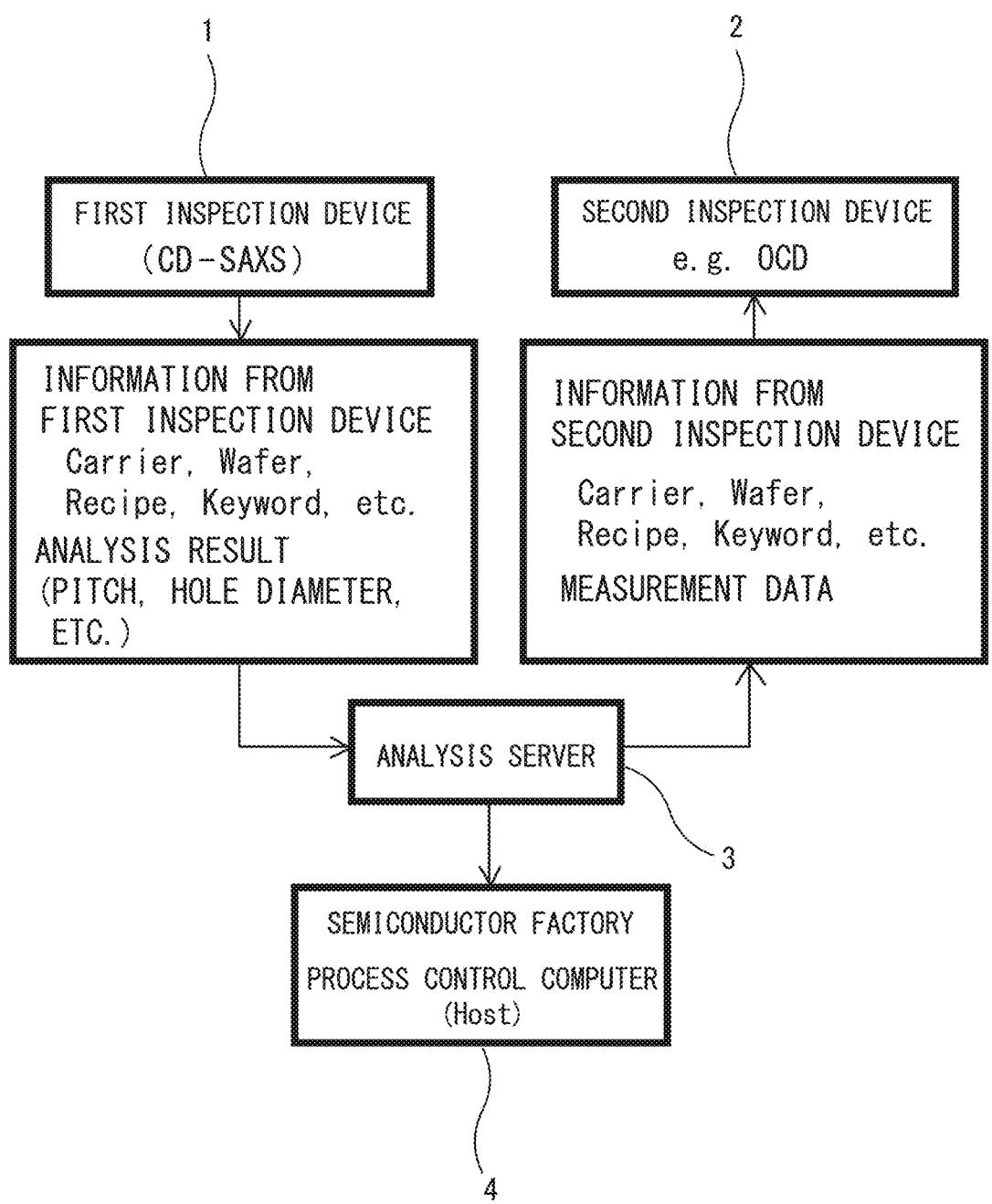
FIG. 4 is a block diagram, schematically showing a fourth basic configuration example and an information transmission system of the hybrid inspection system according to the embodiment of the present invention.

On the other hand in a fourth basic configuration example shown in FIG. 4, the first inspection device 1 and the second inspection device 2 are connected to the analysis server 3, and the analysis server 3 is further connected to the host computer 4 in this basic configuration example, the analysis result of the first inspection device 1 and the measurement data of the second inspection device 2 are respectively output to the analysis server 3, and the analysis server 3 analyzes the measurement data from the second inspection device 2. The analysis result is transmitted from the analysis server 3 to the host computer 4.

For example, when OCD is used as the second inspection device 2, it is impossible to analyze minute information such as a fine pitch of 10 nm or less or a difference in pitch of multiple exposure. It is passible to perform accurate analysis for the first time by using these analysis results of the first inspection device 1.

Figure 5:
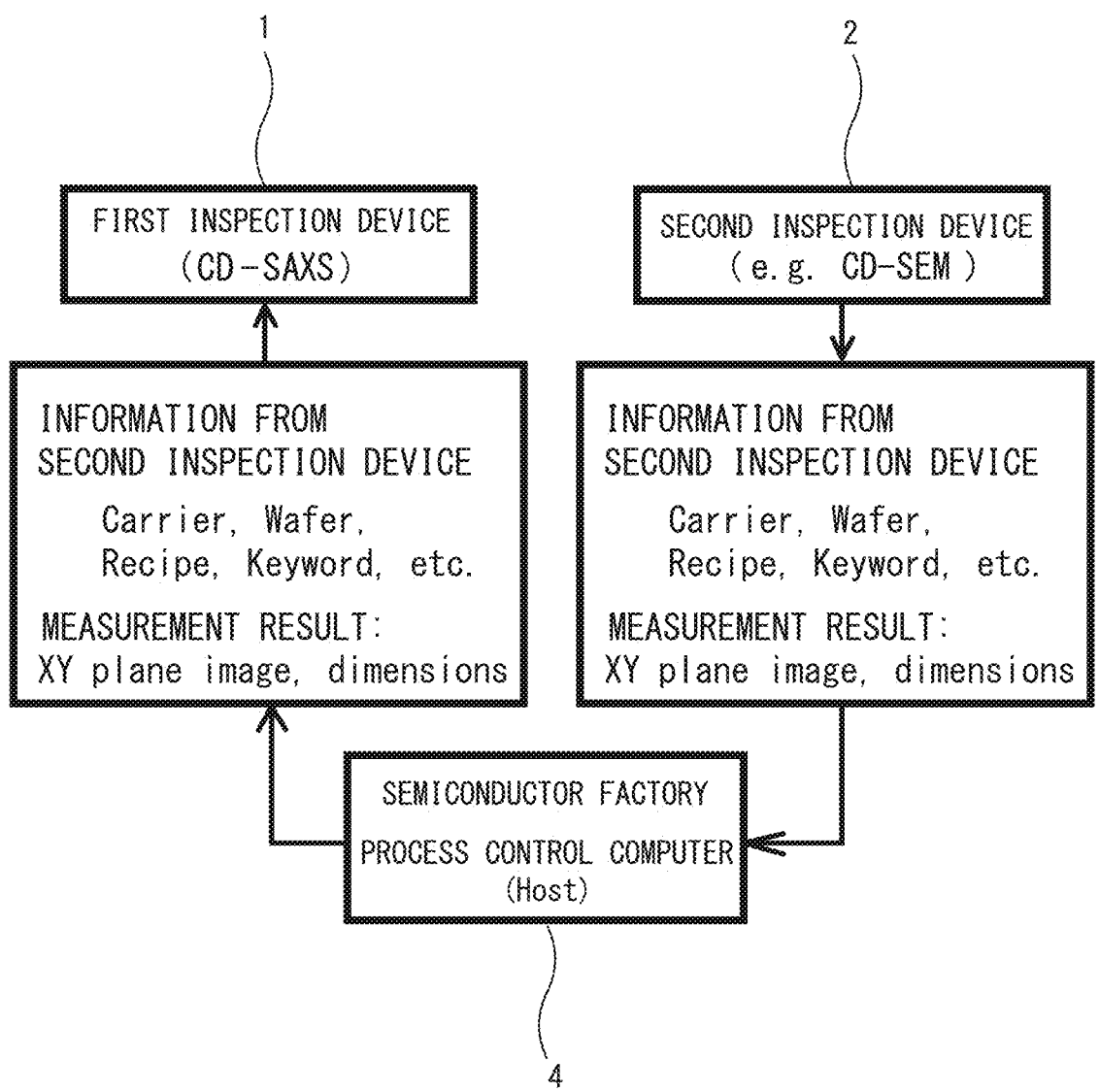
FIG. 5 is a block diagram schematically showing a fifth basic configuration example and an information transmission system of the hybrid inspection system according to the embodiment of the present invention.

In a fifth basic configuration example shown in FIG. 5, information from the second inspection device 2 is output to the first inspection device 1. By transmitting an analysis result obtained by the second inspection device 2 and the sample information (Carrier, Wafer information), it is possible to perform high-precision analysis in the first inspection device 1.

In the fifth basic configuration example, the first inspection device 1 and the second inspection device 2 are connected to each other via the host computer 4 (Host) that takes charge of controlling the process in a semiconductor factory, but unlike the third basic configuration example, the result of the second inspection device 2 is transmitted to the host computer 4. In a semiconductor manufacturing factory that normally uses 300 mm wafers, information is transmitted according to a standardization protocol called as GEM300. Information transmission of the first and second inspection devices 1 and 2 is enabled by programming the host computer 4.

[Outline of OCD Applied to Second Inspection Device]

The optical inspection device (OCD) is used for three-dimensional shape measurement of a fine repeated pattern such as a line-and-space in a semiconductor device.

The measurement and analysis procedure by OCD is as follows.

First, prior to the measurement, many specific models of OCD in which parameters such as a detailed structure and a material property of a measurement target sample are input are created, and stored as a library.

Next, measurement is performed on the measurement target sample. With respect to a measurement method, some measurement methods containing a method for making a white light source incident to a measurement target sample via a polarizer and detecting light scattered from a fine pattern by a spectroscope via an analyzer to measure a spectral waveform (spectroscopic ellipsometer), a method of making light incident to a measurement target sample from just above the measurement target sample and measuring the reflectance of the measurement target sample (reflectometer), etc. are combined with one another to enable measurement of a complex structure.

The spectral waveform obtained by the measurement is compared with waveforms calculated from OCD models, and a shape providing the most matching waveform out of these waveforms is determined as the shape of the measurement target sample.

On the basis of this determination result, the shape is visualized, and dimensions of respective parts are output. The thus-obtained result is fed back to creation of a model, and analysis precis on is enhanced.

Since OCD uses the aforementioned analysis method, OCD has advantages that it is possible to perform efficient measurement of dimensions in a measurement range of patterns matching the models in the library, and OCD is applied to an in-line inspection for a semiconductor manufacturing process.

However, OCD also has the following disadvantages.

First, it takes a lot of time to create a library. Also, in order to create a library, it is necessary to prepare a large number of real samples for references, which increases the number of steps and the cost.

OCD has a property that when the material or shape around a site-under-measurement varies, the spectral waveform greatly varies due to the variation of the material or shape. Therefore, when there is a variation in process or a change in product specification, it is necessary to start from re-creation of a library, which will require a lot of labor. Therefore, OCD may be unusable according to the material or shape to be used.

Furthermore, miniaturization of semiconductors has been progressing day by day, and when a fine pattern of 10 nm or less is measured, the resolution is limited by the wavelength range of incident light, which has made it difficult to perform accurate measurement of dimensions.

[Outline of CD-SEM Applied to Second Inspection Device]

An inspection device (CD-SEM) using a scanning electron microscope (SEM) has been widely used in semiconductor manufacturing lines as a standard machine for measuring a two-dimensional dimension of a fine pattern in a semiconductor device.

The measurement and analysis procedure by CD-SEM is as follows.

That is, an SEM image is acquired with respect to a measurement target sample, and the dimension of the measurement target sample is calculated from the image. The principle of image acquisition is the same as ordinary SEM, in which an electron beam is focused to a minute diameter by using an electron lens and scanned on the measurement target sample, and a secondary electron image and a back-scattered electron image which are emitted from the measurement target sample are detected to obtain an image. The dimension calculation uses a contrast signal of an SEM image. A contrast distribution (line profile) of a place for which dimension measurement is desired on the image is obtained, and the dimension of the measurement target sample is calculated from this line profile, an image magnification and the number of pixels in a measurement section.

Since CD-SEM has an advantage that it has a deeper focal depth and can accurately measure the dimension of the bottom of a pattern as compared with an optical type, and CD-SEM has been widely accepted as a standard machine for dimension measurement in the current semiconductor manufacturing line.

However, CD-SEM also has the following disadvantages.

Since a calculated dimension changes depending on how to extract an edge part from a line profile, reliability of a measurement result is low. Furthermore, there is a risk that an electron beam may destroy a measurement target (particularly, an organic material such as a resist or the like), and it is impossible to perform dimension measurement in the depth direction.

Since CD-SEM has these disadvantages, there is a high possibility that. CD-SEM will not be able to deal with future manufacturing of semiconductor devices which will progress to further miniaturization and three-dimensionalization.

[Entire Structure Example 1 of First Inspection Device (GI-SAXS)]

Figure 6:
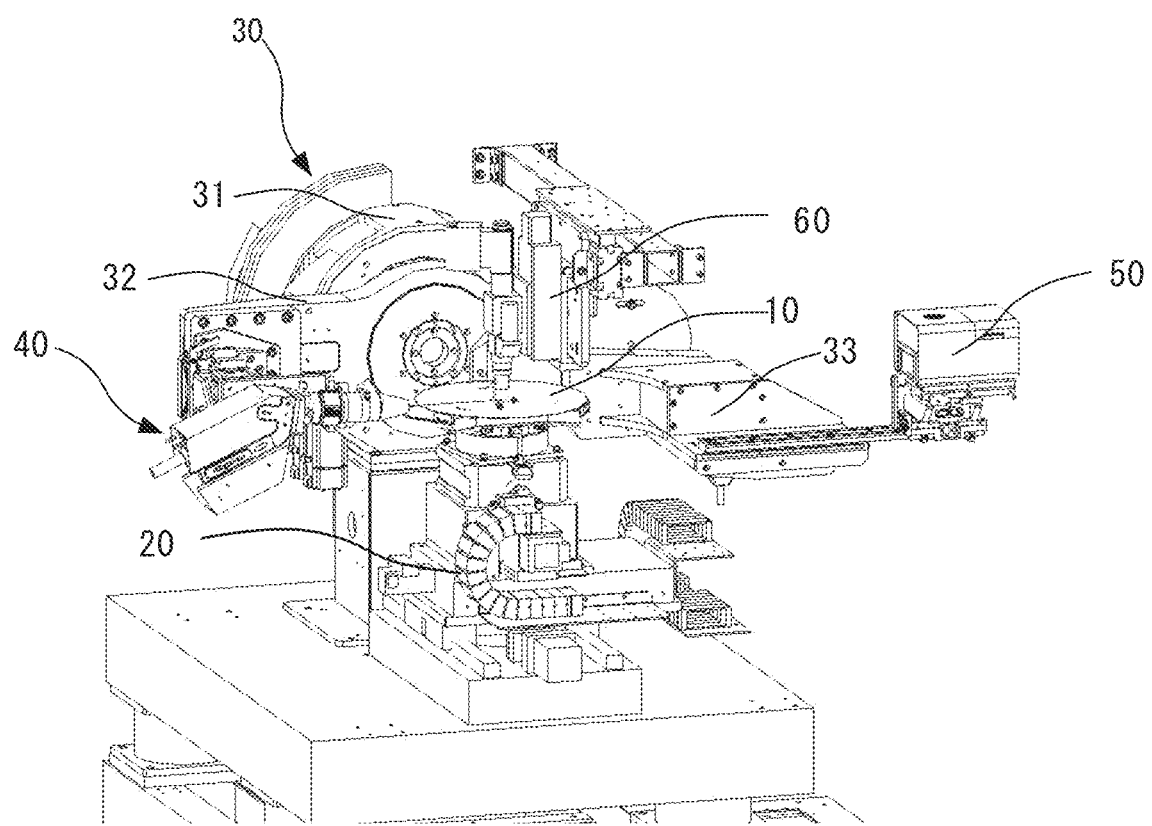
FIG. 6 is a perspective view showing the entire structure of a first inspection device according to the embodiment of the present invention.
Figure 7:
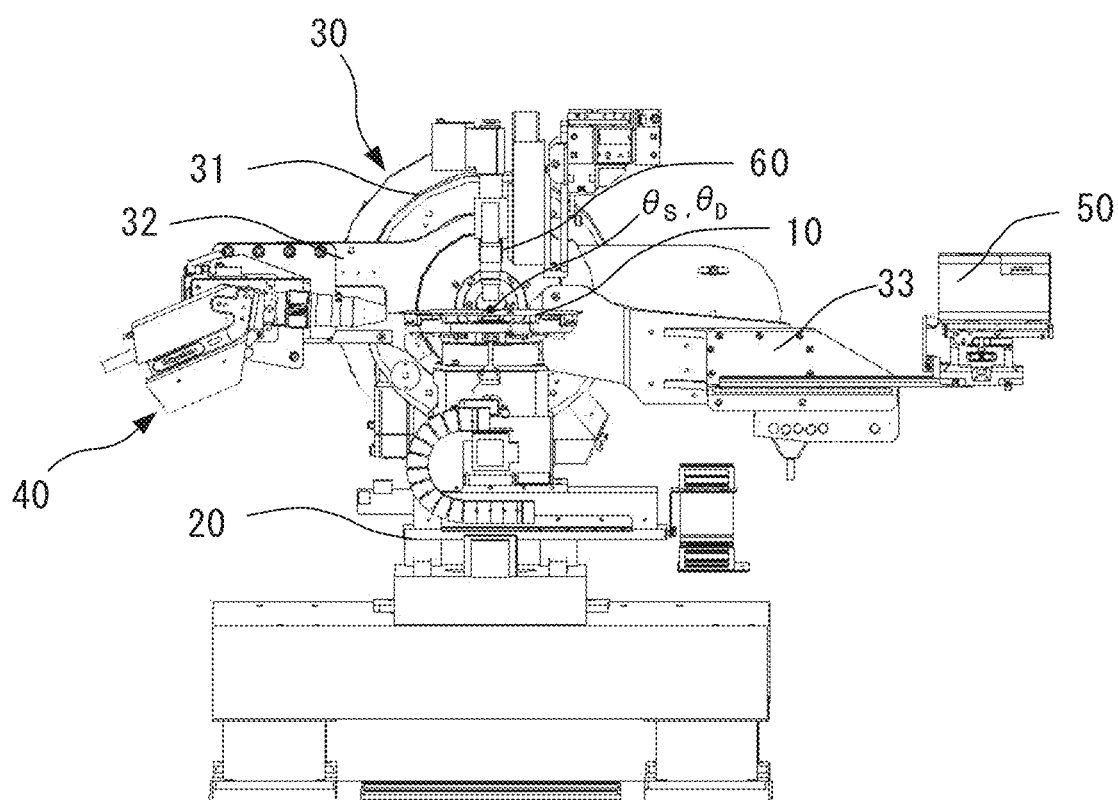
FIG. 7 is a front view of the first inspection device shown in FIG. 6.

FIG. 6 is a perspective view showing the entire structure of the first inspection device, and FIG. 7 is a front view of the same device.

The first X-ray inspection device 1 includes a sample stage 10, a positioning mechanism 20, a goniometer 30, an X-ray irradiation unit 40, an X-ray detector 50, and an optical microscope 60 including a CCD camera and the like.

A semiconductor wafer (sample) as an inspection target is placed on an upper surface of the sample stage 10, and driven by the positioning mechanism 20. The positioning mechanism 20 includes a horizontal movement mechanism which is freely movable in two orthogonal directions (X and Y directions) in a horizontal plane, an elevation mechanism which is freely movable in a vertical direction (Z direction)

orthogonal to the horizontal plane, and an in-plane rotation mechanism, and has a function of moving the sample stage 10 in the X, Y, and Z directions and rotating the sample stage 10 in a plane so that any site under measurement on the semiconductor wafer placed on the upper surface of the sample stage 10 is positioned at a focusing position of irradiated X-rays while set in a predetermined oriented state.

The goniometer 30 includes first and second rotation arms (rotation members) 32 and 33 installed in a goniometer main body 31. Each of the rotation arms 32 and 33 rotates along a virtual plane perpendicular to the upper surface of the sample stage around an axis ($\theta_s$-axis, $\theta_D$-axis) vertical to the paper surface of FIG. 7. Here, the respective rotation arms 32 and 33 are rotated while the rotation angle of the first rotation arm 32 from the horizontal position thereof is set to $\theta_s$ and the rotation angle of the second rotation arm 33 from the horizontal position thereof is set to $\theta_D$.

The X-ray irradiation unit 40 is installed in the first rotation arm 32 rotating around the $\theta_s$-axis. The X-ray detector 50 is installed in the second rotation arm 33 rotating around the $\theta_D$-axis.

The X-ray irradiation unit 40 has a function of monochromatizing X-rays generated from the X-ray tube into characteristic X-rays of a specific wavelength, and also focusing the X-rays on one place.

A position to which characteristic X-rays from the X-ray irradiation unit 40 are irradiated is an inspection position, and a site-under-measurement of a sample placed on the upper surface of the sample stage 10 is positioned at this inspection position by the positioning mechanism 20. It is to be noted that the inspection position is set on the same plane as the surface of the sample placed on the sample stage 10.

The X-ray detector 50 is used for X-ray reflectance measurement (XRR), small angle X-ray scattering (SAXS) measurement. According to the X-ray reflectance measurement, the measurement precision of an angstrom order in film thickness is achieved because interference between reflected X-rays on the film surface and reflected X-rays at the interface between the film and the substrate is measured to derive film thickness and density.

For example, by using a two-dimensional X-ray detector as the ray detector 50, it is also possible to carry out the X-ray reflectance measurement in a TDI mode and the small angle X-ray scattering measurement in a still (Still) mode.

A site-under-measurement of a sample (for example, a semiconductor wafer) placed on the sample stage 10 is arranged at a lower position of the optical microscope 60 by moving the sample stage 10 by the positioning mechanism 20. Then, by moving the sample stage 10 in the horizontal direction from this position to the inspection position, the site-under-measurement of the sample (for example, the semiconductor wafer) is positioned at the inspection position.

[Configuration Example 1 of X-ray Irradiation Unit (GI-SAXS)]

Next, a configuration example of the X-ray irradiation unit 40 will be described.

Figure 8A:
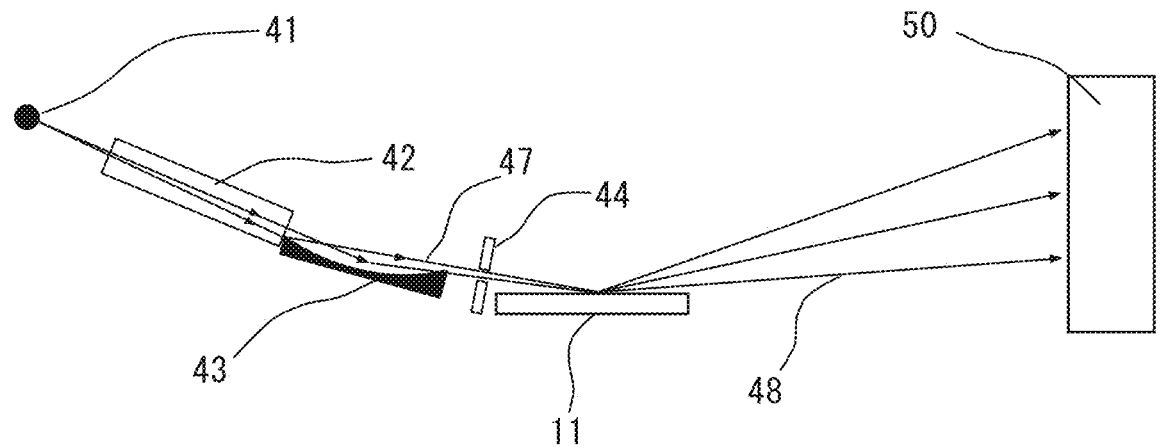
FIG. 8A is a side view schematically showing a configuration of an X-ray irradiation unit incorporated in the first inspection device shown in FIG. 6.
Figure 8B:
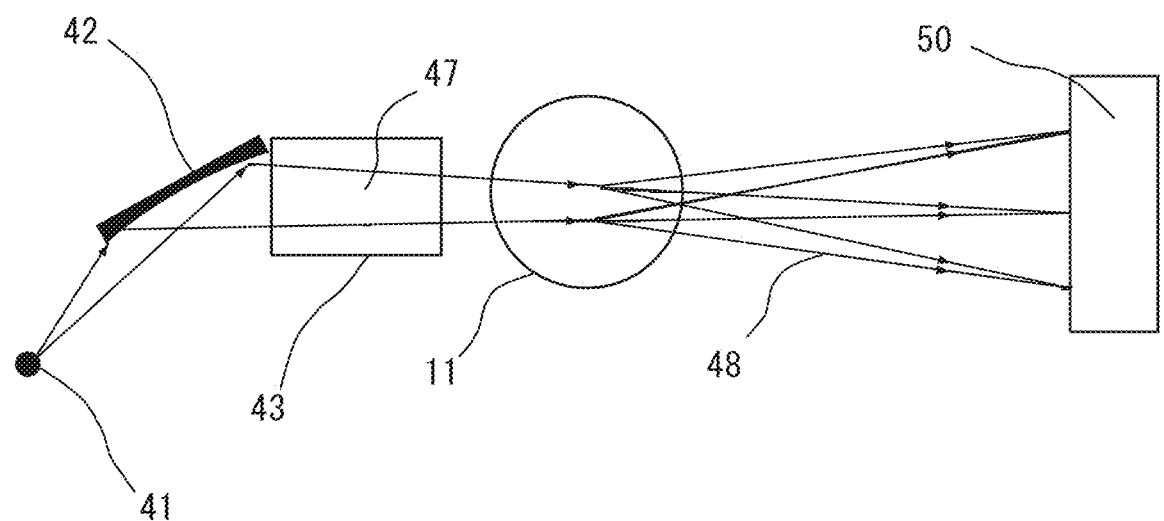
FIG. 8B is likewise a plan view.

FIGS. 8A and 8B schematically show a configuration example of a preferred X-ray irradiation unit 40 when the first inspection device 1 is constituted by a reflection type small angle X-ray scattering device (GI-SAXS). FIG. 8A is a side view, and FIG. 8B is a plan view.

The X-ray irradiation unit 40 includes an X-ray tube 41, a first X-ray optical element 42, a second X-ray optical element 43, and a focusing slit 44. A focusing mirror having a multilayer formed on the surface thereof is used for the first and second X-ray optical elements 42 and 43. These components are incorporated in a unit main body (not shown). The unit main body is configured to be compact in dimension and shape such that it can be installed in the first rotation arm 32.

Next, a path of X-rays will be described. An X-ray tube having an electron beam focal point size of $\phi$100 μm or less, preferably 20 μm or less on a target is used as the X-ray tube 41. As the target material may be selected copper (Cu), molybdenum (Mo), silver (Ag), gold (Au), or the like. In particular, when copper (Cu) is used, it is possible to measure small angle scattering having high angular resolution.

X-rays emitted from the X-ray tube 41 first reach the first X-ray optical element 42. Then, scattered X-rays 48 are focused on the position of the X-ray detector 50 by the first X-ray optical element 42. As a result of the focusing of the scattered X-rays 48 on the X-ray detector 50 as described above, it is possible to perform measurement with high angular resolution.

Next, the X-rays are incident to the second X-ray optical element 43, and focused in the vertical direction, so that incident X-rays 47 are focused on the surface of a sample 11. This also makes it possible to perform measurement with high angular resolution when X-rays are incident to the surface of the sample 11 at a grazing angle to perform X-ray reflectance measurement or small angle X-ray scattering measurement.

[Configuration Example 2 of First inspection Device (T-SAXS)]

Figure 9:
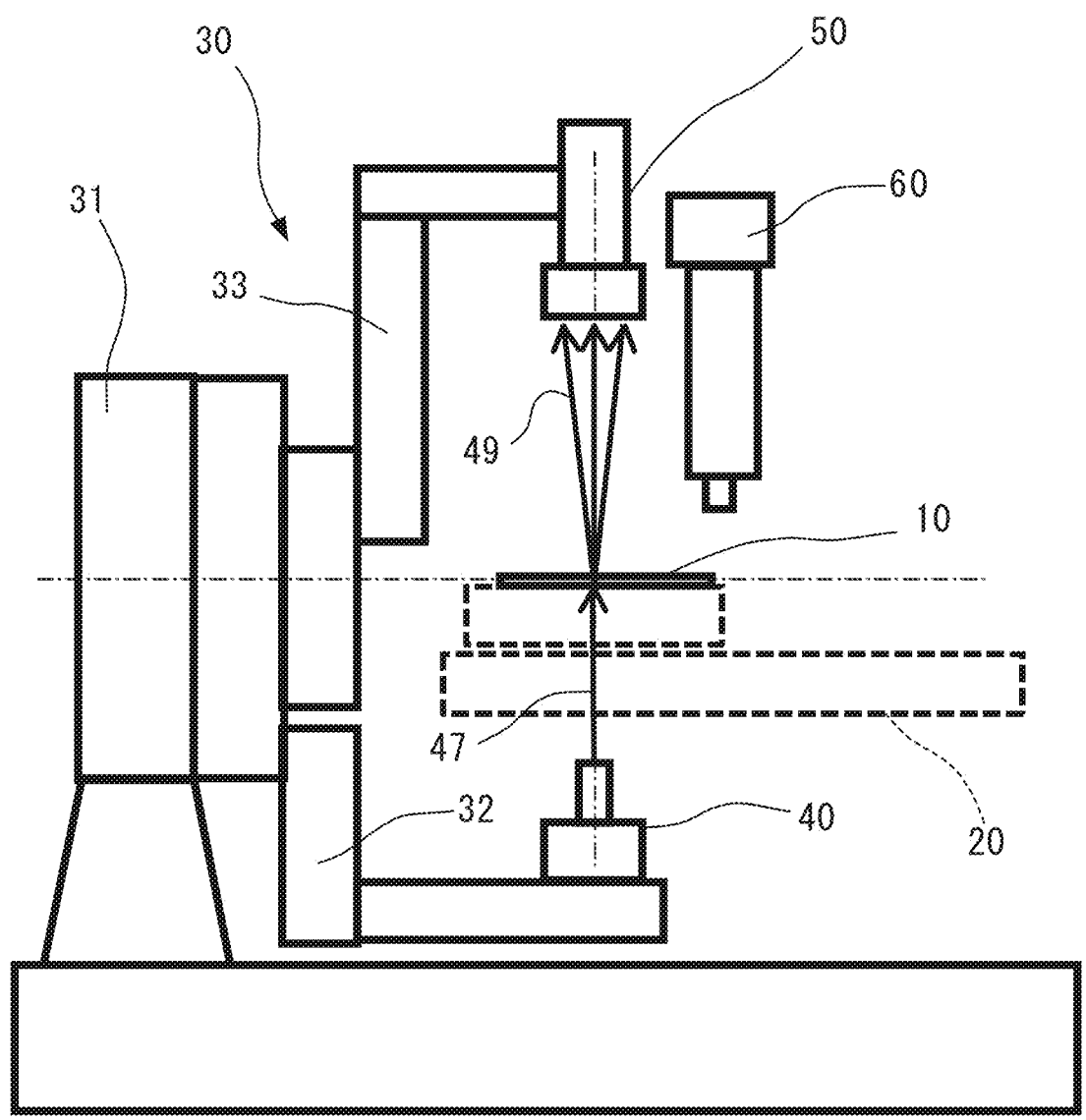
FIG. 9 is a is a front view schematically showing another configuration example of the first inspect ion device according to the embodiment of the present invention.
Figure 10:
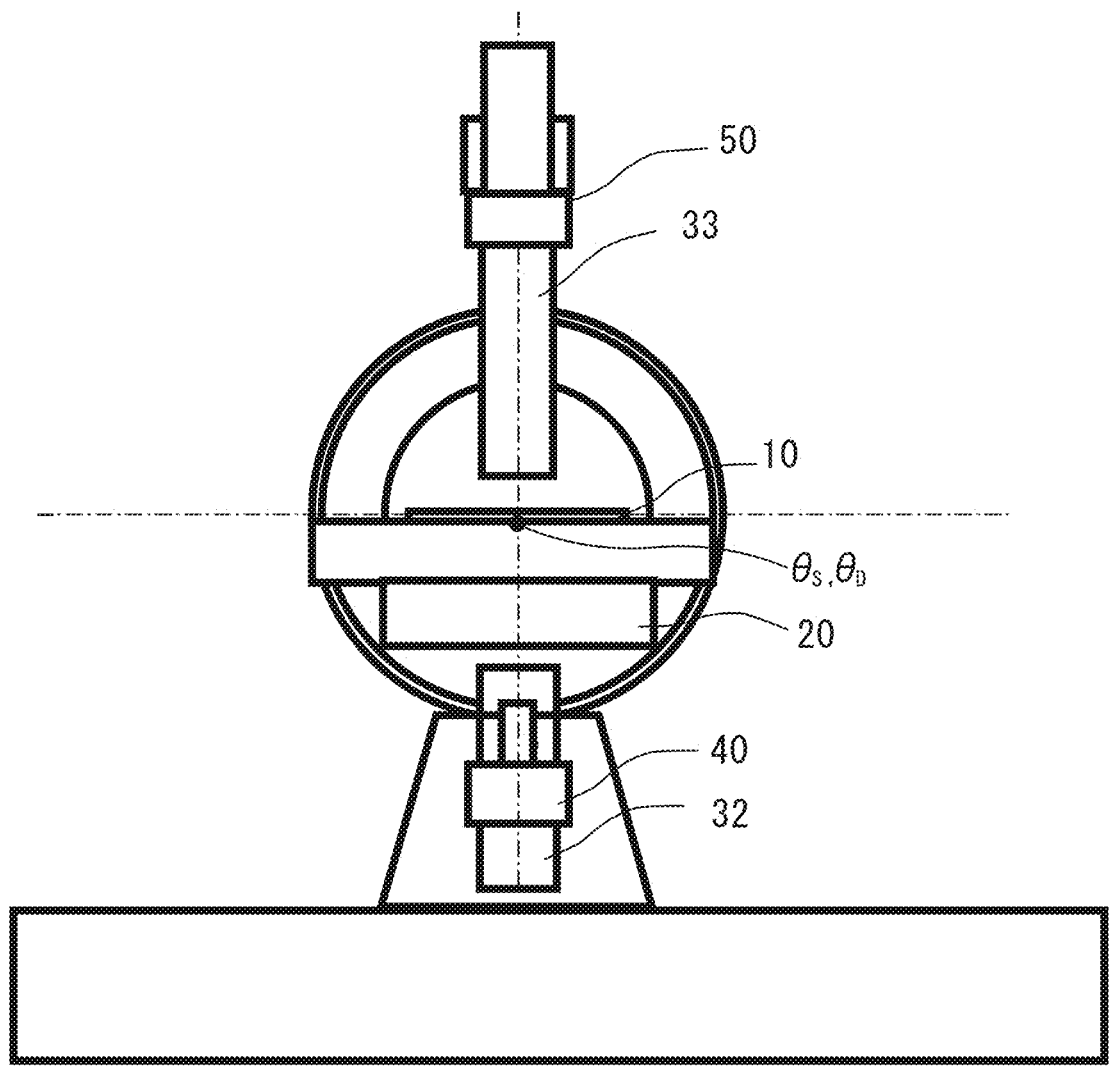
FIG. 10 is a right side view schematically showing the configuration of the first inspection device shown in FIG. 9.

FIG. 9 is a front view schematically showing another configuration example of the first inspection device, and FIG. 10 is likewise a right side view.

The first inspection device 1 shown in these figures has a configuration suitable for a transmission type small angle X-ray scattering device (T-SAXS).

The first inspection device 1 shown in these figures includes a sample stage 10, a positioning mechanism 20, a goniometer 30, an X-ray irradiation unit 40, an X-ray detector 50, and an optical microscope 60 having a CCD camera, etc. installed therein in FIG. 10, the optical microscope 60 is omitted.

A semiconductor wafer (sample) as an inspection target is placed on an upper surface of the sample stage 10, and driven by the positioning mechanism 20. The positioning mechanism 20 includes a horizontal movement mechanism which is freely movable in two orthogonal directions (X and Y directions) in a horizontal plane, an elevation mechanism which is freely movable in a vertical direction (Z direction) orthogonal to the horizontal plane, and an in-plane rotation mechanism, and has a function of moving the sample stage 10 in the X, Y, and Z directions and rotating the sample stage 10 in a plane so that any site-under-measurement on the semiconductor wafer placed on the upper surface of the sample stage 10 is positioned at a focusing position of irradiated X-rays while set in a predetermined oriented state.

The goniometer 30 includes first and second rotation arms (rotation members) 32 and 33 installed in a goniometer main body 31. Each of the rotation arms 32 and 33 rotates along a virtual plane perpendicular to the upper surface of the sample stage around an axis ($\theta_s$-axis, $\theta_D$-axis) vertical to the paper surface of FIG. 10. Here, the respective rotation arms 32 and 33 are rotated while the rotation angle of the first rotation arm 32 from the horizontal position thereof is set to $\theta_s$ and the rotation angle of the second rotation arm 33 from the horizontal position thereof is set to $\theta_D$.

The X-ray irradiation unit 40 is installed in the first rotation arm 32 rotating around the $\theta_s$-axis. The X-ray detector 50 is installed in the second rotation arm 33 rotating around the $\theta_D$-axis.

Figure 11:
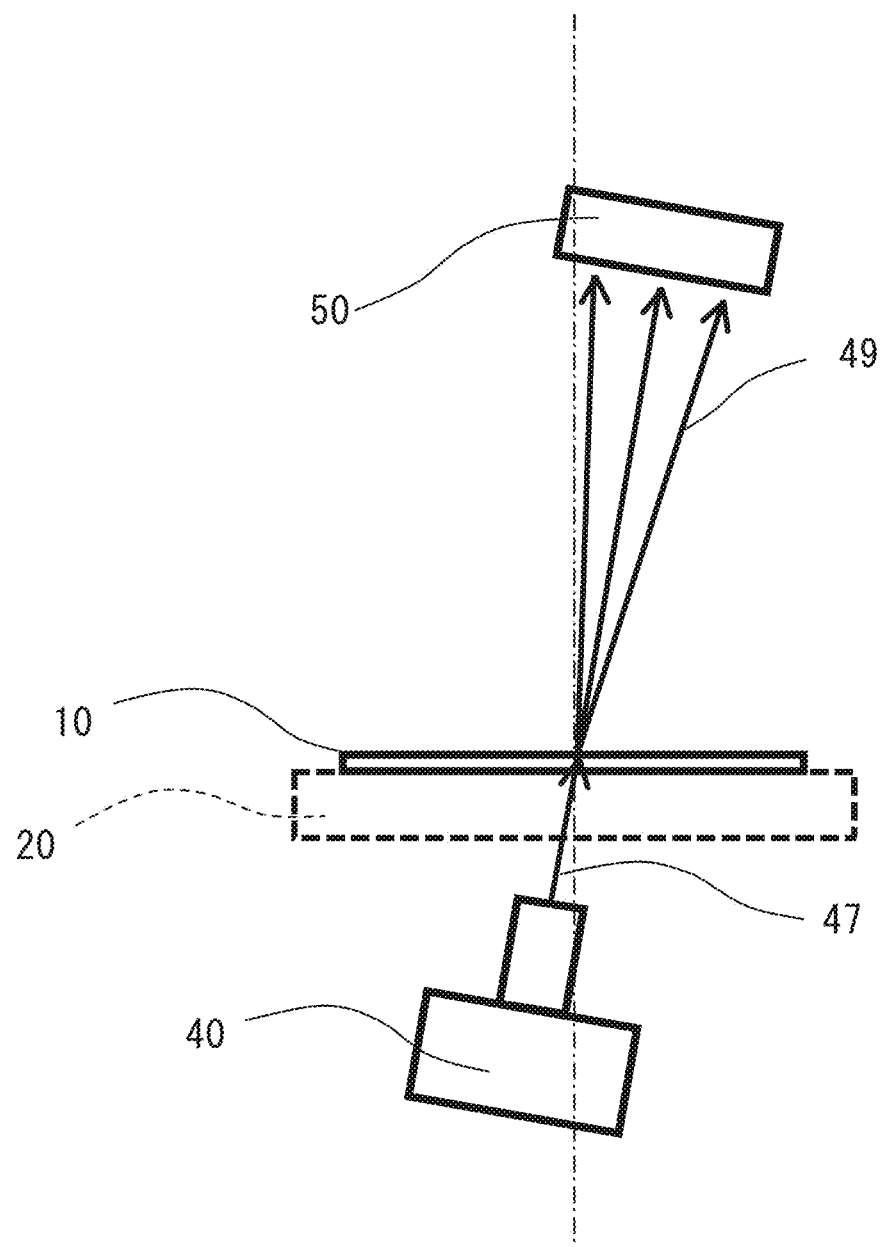
FIG. 11 is a schematic diagram showing a measurement operation by the first inspection device shown in FIG. 9.

In the configuration example of the first inspection device 1 shown in FIGS. 9 and 10, the rotation angle $\theta_s$ from the horizontal position of the first rotation arm 32 can be set so that the first rotation arm 32 can be driven to a position below the sample stage 10 (that is, −90°), thereby enabling measurement of transmitted X-rays 49 as shown in FIG. 11. Therefore, the first inspection device 1 having the aforementioned configuration can be applied to a transmission type small angle X-ray scattering device (T-SAXS).

Since the sample stage 10 and the positioning mechanism 20 are required to transmit X-rays therethrough, they are formed of carbon, boron carbide, kapton or the like which has a small X-ray absorption coefficient, or configured to become hollow.

In FIG. 9, supporting mechanisms for the positioning mechanism 20 and the optical microscope 60 are omitted from the illustration, but these supporting mechanisms are arranged not to interfere with the rotation arms 32, 33 of the goniometer and components around the X-ray irradiation unit 40, the X-ray detente 50, etc.

[Configuration Example 2 of X-ray Irradiation Unit (T-SAXS)]

Next, a configuration example of the X-ray irradiation unit 40 will be described.

Figure 12A:
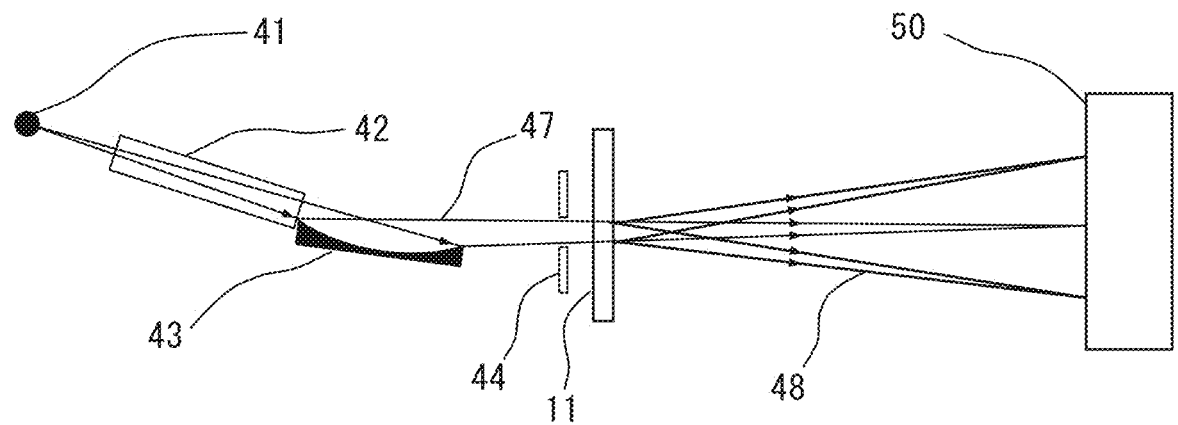
FIG. 12A is a side view schematically showing a configuration of an X-ray irradiation unit incorporated in the first inspection device shown in FIG. 9.
Figure 12B:
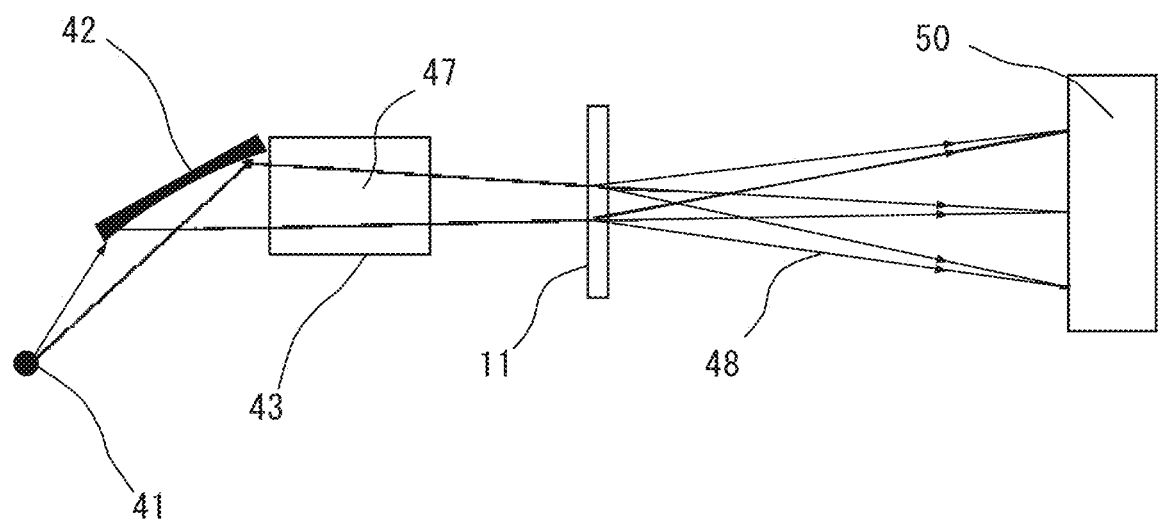
FIG. 12B is likewise a plan view.

FIGS. 12A and 12B schematically show a configuration example of a preferable X-ray irradiation unit 40 when the first inspection device 1 is constituted by a transmission type small angle X-ray scattering device (T-SAXS). FIG. 12A is a side view, and FIG. 12B is a plan view.

The X-ray irradiation unit 40 shown in these figures includes an X-ray tube 41, a first X-ray optical element 42, a second X-ray optical element 43, and a focusing slit 44 as components. A focusing mirror having a multilayer formed thereon is used for the first and second X-ray optical elements 42 and 43.

These X-ray optical elements 42 and 43 are configured to be enclosed in a housing (not shown) in order to prevent deterioration of the multilayer. The housing has a mounting structure which prevents application of unnecessary stress so that the X-ray optical elements 42 and 43 incorporated in the housing are not displaced or deformed. In addition, in order to enable fine adjustment of the optical system, a position adjustment mechanism is provided to enable high-precision positioning in the respective directions of an X-axis, a Y-axis, and a Z-axis.

Next, a path of X-rays which are emitted from the X-ray tube 41 and reach the X-ray detector 50 will be described.

First, an X-ray tube having an electron beam focal spot size of $\phi$100 μm or less, preferably 20 μm or less on a target is used as the X-ray tube 41. As the target material may be selected copper (Cu), molybdenum (Mo), silver (Ag), gold (Au) or the like. In the case of the transmission type, high energy X-rays which can transmit through a Si wafer as a substrate are required, and thus it is desirable to use molybdenum (Mo) or silver (Ag) that can satisfy the above requirement.

The X-rays emitted from the X-ray tube 41 first reach the first X-ray optical element 42. The X-rays are focused in a horizontal direction (a direction parallel to the paper surface in FIG. 12B) by the first X-ray optical element 42 so that the X-rays are focused on the position of the X-ray detector 50. Next, the X-rays are focused in a vertical direction (a direction parallel to the paper surface in FIG. 12A) by the second X-ray optical element 43 so that the X-rays are likewise focused on the position of the X-ray detector 50. The focused X-rays are incident to a measurement sample. The X-rays are scattered by minute grooves or wires formed on the measurement sample and transmitted through the sample, and then reach the X-ray detector 50.

A method of controlling the optical axis of X-rays by using the first and second X-ray optical elements 42 and 43 as described above is called as a Kirkpatrick-Baez method. The advantage of this method is that the degree of freedom of shape control of the focal spot is high because two mirrors can be adjusted independently of each other. As another method, although not shown, there is a method in which two mirrors are integrated into an angular shape (L-shape), and this method may be used. The method in which the two mirrors are integrated into an angular shape (L-shape) is called as a side-by-side method, and it has merits that the optical system can be made compact and alignment is easy.

[Control System of First Inspection Device]

Figure 13:
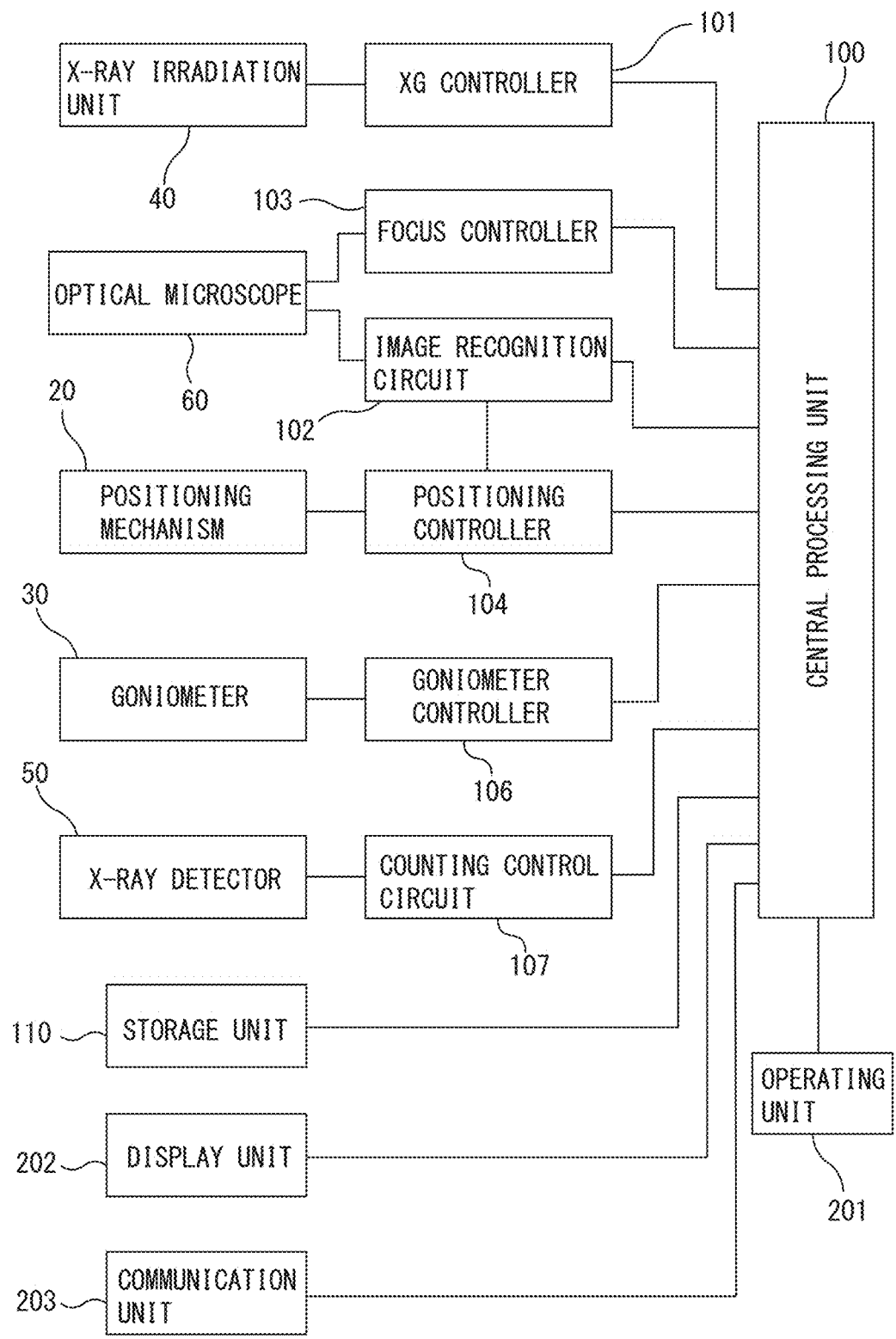
FIG. 13 is a block diagram showing a control system of the first inspection device according to the embodiment of the present invention.

FIG. 13 is a block diagram showing a control system of the first inspection device.

The control of the X-ray irradiation unit 40 is executed by an XG controller 101.

An image of the sample captured by the optical microscope 60 is subjected to image recognition by an image recognition circuit 102. The optical microscope 60 and the image recognition circuit 102 constitute an image observing unit for observing the image of the sample placed on the sample stage 10. The focal position of the optical microscope 60 is adjusted by a focus controller 103.

A positioning controller 104 drives and controls the positioning mechanism 20 based on the image of the sample which is captured by the optical microscope 60 and recognized by the image recognition circuit 102.

The goniometer 30 is controlled to be driven by a goniometer controller 106.

The respective components of the XC controller 101, the image recognition circuit 102, the focus controller 103, the positioning controller 104, and the goniometer controller 106 operate based on setting information transmitted from a central processing unit (CPU) 100. Here, the setting information is stored as a recipe in a storage unit 110 in advance, and the central processing unit (CPU) 100 reads out the setting information and outputs it to the respective components.

The X-ray detector 50 is controlled by a counting control circuit 107.

Furthermore, the first inspection device 1 is provided with an operating unit 201 including a keyboard, a mouse, etc. for inputting various settings necessary for the operation of the device by an operator. Furthermore, the first inspection device 1 includes a display unit 202 constituted by a liquid crystal display or the like, and a communication unit 203 for performing data communication via a network.

[Procedure of Executing X-ray Thin Film Inspection Method by First Inspection Device]

Figure 14:
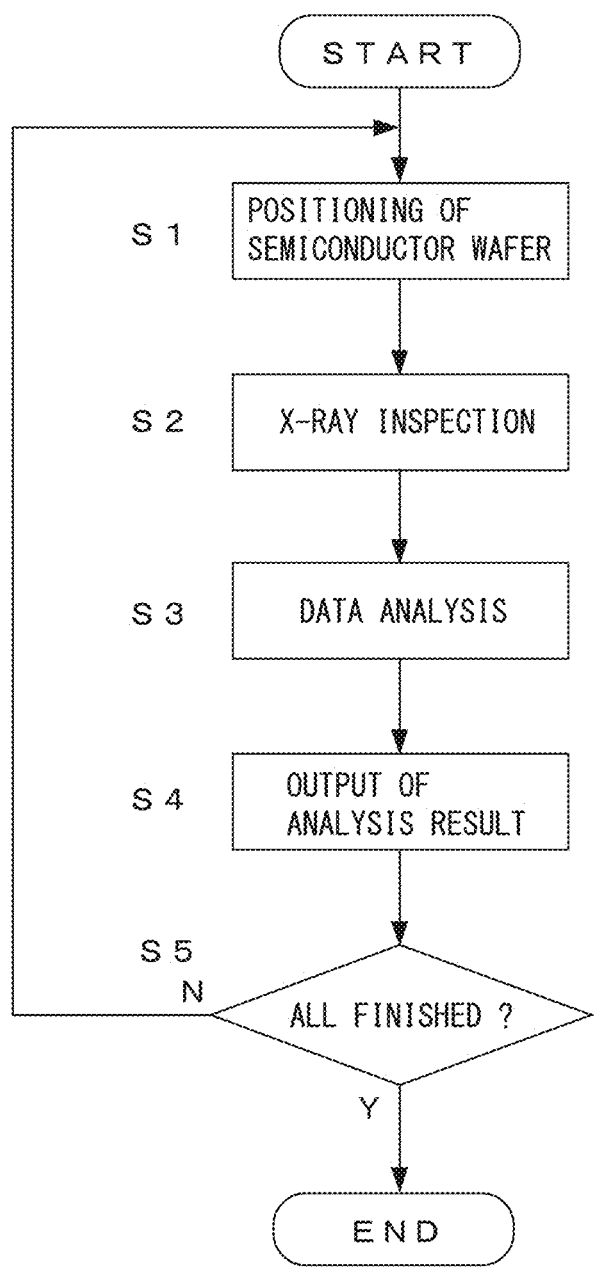
FIG. 14 is a control flowchart of the first inspection device according to the embodiment of the present invention.

FIG. 14 is a flowchart showing an execution procedure of the X-ray thin film inspection method by the first inspection device targeting a semiconductor wafer as an inspection target.

Software for executing the X-ray thin film inspection is stored in the storage unit 110 in advance, and the central processing unit (CPU) 100 executes the following processing steps according to the software.

After a semiconductor wafer which is an inspection target sample is placed on the sample stage 10, a site-under-measurement of the semiconductor wafer is first positioned at an inspection position (step S1). Here, a unique point on the surface of the semiconductor wafer, which can be specified based on image information from the optical microscope 60 by the image recognition circuit 102, is preset as a recipe in the storage unit 110. Then, based on the unique point, position information of the site-under-measurement is preset as a recipe in the storage unit 110. As the unique point is set, for example, a site which can be recognized without doubt on determination by the image recognition circuit 102, such as a characteristic pattern shape formed on the surface of the semiconductor wafer.

The image recognition circuit 102 recognizes and specifies the unique point set on the surface of the semiconductor wafer placed on the sample stage 10 from the image information from the optical microscope 60.

Next, with the unique point recognized by the image recognition circuit 102 as a reference, the positioning controller 104 drives and controls the positioning mechanism 20 based on preset position information of the site-under-measurement. The positioning mechanism 20 moves the sample stage 10 in two horizontal directions (X-Y directions) and a height direction (Z direction) to place the site-under-measurement of the semiconductor wafer at the inspection position. If necessary, the semiconductor wafer is rotated in-plane by an in-plane rotating mechanism to be arranged in a predetermined orientation.

After the site-under-measurement of the semiconductor wafer is positioned as described above, X-ray inspection is executed (step S2), and the central processing unit 100 analyzes inspection data (step S3), and outputs an analysis result (step S4).

The above steps are executed on all site-under-measurements of set on the semiconductor wafer (step S5), and finished after the inspection of all the site-under-measurements has been completed.

[GI-SAXS Measuring Method by First Inspection Device]

Next, a surface microstructure measuring method for measuring a microstructure on the surface of the sample when a reflection type small angle X-ray scattering device (GI-SAXS) is applied as the first inspection device 1 will be described.

First, a sample is placed on the sample stage so that X-rays can be made incident from a direction orthogonal to a cross-section which is desired to be measured. For example, when a two-dimensional cross-section such as a line pattern is measured, the sample is placed such that the line direction and the direction of the incident X-rays are parallel to each other, and then the measurement is performed. For example, when a three-dimensional cross-section such as a hole pattern or a pillar pattern is measured, the sample is placed such that plural incident directions can be selected according to the in-plane symmetry of the three-dimensional cross-section, and then the measurement is performed.

The X-ray incidence angle to the sample surface is set in the vicinity of the total reflection critical angle. By making X-rays incident in the vicinity of the total reflection critical angle, it is possible to measure a microstructure on the surface with high sensitivity.

In order to obtain microstructure information in the normal direction of the sample surface, it is required to change the scattering vector in the normal direction of the sample surface. In order to satisfy this requirement, it is necessary to satisfy the diffraction condition in a region where the emission angle from the sample surface is large. This can be realized by rotating the sample in-plane while the X-ray incident direction is made orthogonal to a cross-section which is desired to be measured.

An X-ray diffraction pattern is recorded by a two-dimensional detector while rotating the sample in-plane.

[T-SAXS Measuring Method by First Inspection Device]

Next, the surface microstructure measuring method for measuring a microstructure on a sample surface when a transmission type small angle X-ray scattering device (T-SAXS) is applied as the first inspection device will be described.

First, a sample is placed on the sample stage so that X-rays can be made incident from a direction perpendicular to the sample surface. When the X-ray incident direction is perpendicular to the sample surface, a structure in a direction parallel to the sample surface can be analyzed. However, in this case, since the scattering vector in the normal direction of the sample surface is almost 0, the structure in the normal direction of the sample surface cannot be analyzed.

Therefore, in order to analyze the structure in the normal direction of the sample surface, it is necessary to change the scattering vector in the normal direction of the sample surface. This can be realized by rotating the sample in-plane while the X-ray incident direction and the sample surface are made vertical to each other.

An X-ray diffraction pattern recorded by a two-dimensional detector while rotating the sample.

As the amount of the rotation angle increases, it is possible to greatly vary the scattering vector in the normal direction of the sample surface, and also it is possible to enhance the real space resolution in the normal direction of the sample surface. The rotation angle range at that time is determined by considering the throughput and analysis precision. Here, by rotating the sample in the direction of a cross-section of interest, data can be efficiently obtained with the minimum rotation angle amount.

[Analysis Method of Measurement Data in First Inspection Device]

A sample model is assumed based on parameters for specifying the shape of a unit structure of a periodic structure of a predetermined sample, and X-ray scattering intensity is calculated by simulation. That is, one or more layers are formed in a direction perpendicular to the surface due to a microstructure on the surface. A sample model in which a unit structure is arranged periodically in a direction parallel to the sample surface in the layers is assumed, and scattering of X-rays which are refracted and reflected from the interfaces among the layers and caused by the microstructure is calculated. Based on a calculation result, the scattering intensity of the X-rays calculated based on the sample model is fitted to the measured scattering intensity. Then, as a result of the fitting, optimum values of parameters specifying the shape of the unit structure are determined.

Figure 15A:
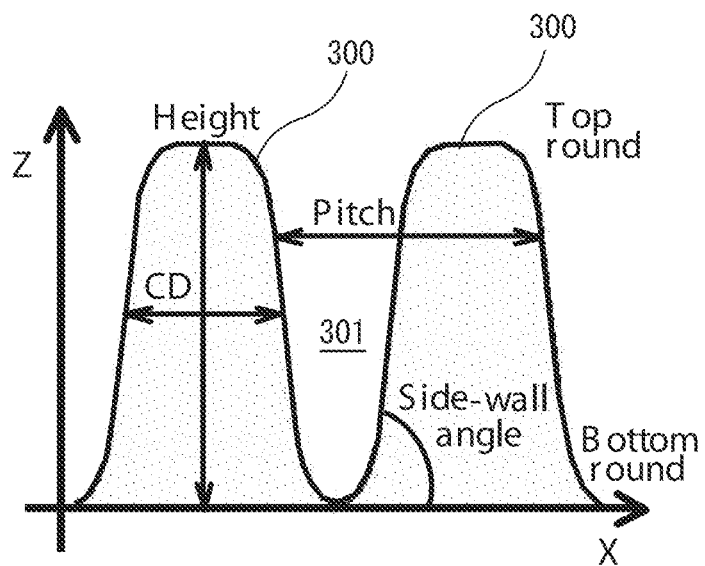
FIG. 15A is a diagram showing parameters for analyzing the shape of a line-and-space pattern as an inspection target.

FIG. 15A is a diagram showing parameters for analyzing the shape of a line-and-space pattern as an inspection target. This shape is formed by alternately repeating a line 300 and a space 301. Here, as a simplest case, a height (Height), a minimum line width (CD; Critical Dimension), a pitch (Pitch), a sidewall angle (Side-Wall Angle), a top round (Top Round), and a bottom round (Bottom Round) are defined for the line 300. It is possible to express an arbitrary shape by combining geometric figures such as an ellipse, a straight line, a curved line, etc. in conformity with an actual shape.

Figure 15B:
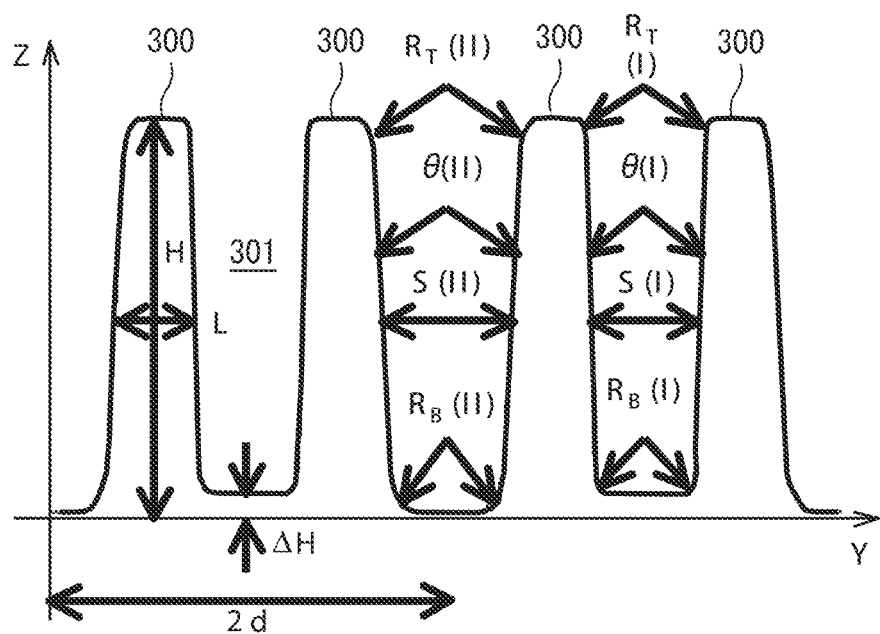
FIG. 15B is a diagram showing parameters for analyzing the shape of a line-and-space pattern created by a double exposure process.

FIG. 15B is a diagram showing parameters for analyzing the shape of a line-and-space pattern created by a double exposure process. A multiple exposure is a method of repeating exposure at plural times because it exceeds the limit of resolution of photolithography. Furthermore, a method of forming a microstructure of 10 nm or less in combination with a method called as self-alignment has been proposed.

By using the first inspection device of the present invention, it is possible to measure deviations among plural photolithography processes as well as a single pitch.

Figure 16B:
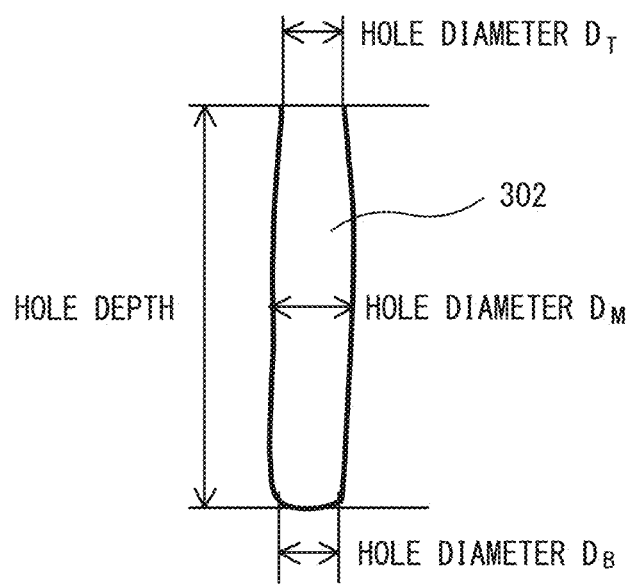

Furthermore, FIG. 16A is a schematic cross-sectional view of a deep-hole repetitive structure as an inspection target FIG. 16B is an enlarged view of one deep hole in the schematic cross-sectional view shown in FIG. 16A. From the viewpoint of process management, it is important to measure the shape of the deep hole 302, but it is possible to measure the hole diameter by the first inspection device 1.

[Analysis Method of Measurement Data in Second Inspection Device]

FIG. 17 is a diagram showing an example of measurement data by an inspection device using a scanning electron microscope (CD-SEM). By using CD-SEM as the second inspection device 2, for example, an observation image of a pattern shape (measurement target) formed on a semiconductor substrate as shown in FIG. 17 can be obtained as measurement data.

The relative size of the pattern shape on the plane can be recognized from this measurement data. For example, from an observation image of CD-SEM shown in FIG. 17, the relative ratio Lx/Ly between the dimension Lx of an X coordinate and the dimension Ly of a Y coordinate, the relative ratio Rx/Lx between the dimension Lx of the X coordinate and a partial dimension Rx, the relative ratio Ry/Ly between the dimension Ly of the Y coordinate and a partial dimension Ry, etc. can be determined as shown in FIG. 18.

[Example of Usage of Output Value from First Inspection Device in Second Inspection Device]

First, an example of usage of an output from the first inspection device (CB-SAXS) when OCD is used as the second inspection device 2 will be described below. As described above, OCD has a property that when the material or shape around the site-under-measurement changes, the spectral waveform greatly varies due to the change of the material or shape. Therefore, when a significantly different spectral waveform is obtained, it is difficult to distinguish whether this is caused by the change of the shape or influence of disturbance. Therefore, this problem is overcome by using the present invention. Measurement is performed with OCD, and when an obtained spectral waveform shows an abnormal value such as not matching with any data calculated from the OCD model, for example, it is compared with the data of CD-SAXS. When the data of CD-SAXS is a normal value, the result of OCD is treated as an abnormal value caused by disturbance. When the value of CD-SAXS is also abnormal, it is treated as shape abnormality. For the CD-SAXS data, a representative point may be measured in advance, or a procedure for measuring a target portion when an abnormality is found in the OCD data may be used. In any case, the CD-SAXS data will be used for OCD inspection. By this method, it is possible to easily enhance the inspection precision of OCD and specify a cause of abnormality.

Next, an example of usage of an output value from CD-SAXS when CD-SEM is used as the second inspection device 2 will be described. As described above, CD-SEM calculates CD by detecting an edge from an acquired line profile. However, since the calculated dimension changes depending on how to extract an edge part, there is a problem that reliability of the measurement result is low. According to the present invention, is possible to solve this problem by using the output value of CD-SAXS to enhance the measurement precision of CD-SEM. First, a certain part of a target sample is measured by CD-SAXS. Next, the same part is measured by CD-SEM to acquire a line profile. These two data are collated with each other to verify which part of the line profile of CD-SEM corresponds to the edge part of the CD-SAXS data, and this is defined as a CD value. Subsequently, the measurement is continued with CD-SEM. By means of such a method, inspection of CD can be executed with high precision and high efficiency.

As described above, the second inspection device 2 can also verify an inspection result by using the output value from the first inspection device 1 (including X-ray measurement data input from the first inspection device 1 or an analysis result of the X-ray measurement data). That is, in the present invention configured to use the output value, etc. from the first inspection device 1 in the second inspection device 2, the second inspection device 2 "inspecting the sample" is a broad concept containing an operation (step) of verifying an inspection result, etc.

[Example of Usage of Output Value from Second Inspection Device in First Inspection Device]

As shown in FIG. 18, an observation image of CD-SEM (second inspection device 2) shown in FIG. 17 is fitted with a shape model of CD-SAXS (first inspection device 1), and a contour position of a pattern shape formed on a semiconductor substrate as a measurement target is estimated by using the shape model. Then, based on estimated contour position, measurement is performed by CD-SAXS and data analysis of a measurement result is executed, thereby calculating the dimension Ly, for example. Dimensions Lx and Ry can be calculated from this calculation result and the relative ratios Lx/Ly and Ry/Ly of the respective dimensions, and also Rx can be calculated. Further, the depth dimension of a pattern shape to be measured can be also analyzed by CD-SAXS.

By utilizing the observation image of CD-SEM (the second inspection device 2), it is possible to estimate the contour position of the pattern shape formed on the semiconductor substrate to be measured, so that the throughput can be enhanced by reducing the measurement range and the number of measurement times.

Furthermore, in the first inspection device 1, an inspection result can be also verified by using the output value from the second inspection device 2 (including X-ray measurement data input from the second inspection device 2 or an analysis result of the X-ray measurement data). That is, even in the present invention configured to use the output value, etc. from the second inspection device 2 in the first inspection device 1, the first inspection device 1 "inspecting the sample" is a broad concept containing an operation (step) of verifying an inspection result, etc.

It is a matter of course that the present invention is not limited to the above-described embodiment, and various modifications and application can be made.

The invention claimed is:

1. A hybrid inspection system including a first inspection device for inspecting a microstructure on a surface of a semiconductor wafer based on X-ray measurement data obtained by irradiating the surface of the semiconductor wafer with X-rays, and a second inspection device for inspecting the microstructure on the surface of the semiconductor wafer by a measuring method using no X-rays, wherein the first inspection device is an X-ray nano shape measuring apparatus using X-ray small angle scattering, one of the X-ray measurement data obtained by the first inspection device and an analysis result of the X-ray measurement data is output to the second inspection device, and the second inspection device inspects the microstructure on the surface of the semiconductor wafer by using one of the X-ray measurement data obtained by the first inspection device and the analysis result of the X-ray measurement data.

2. The hybrid inspection system according to claim 1, wherein the first inspection device includes:

a measuring unit for irradiating the surface of the semiconductor wafer with X-rays and measuring scattering intensity;

a fitting unit for assuming a sample model having a microstructure on the surface of the semiconductor wafer, the microstructure forming a plurality of layers having different refractive indexes in a direction vertical to the surface, and constituting a periodic structure in which a unit structure is periodically arranged in a direction parallel to the surface in the layers, calculating scattering intensity of X-rays scattered by the microstructure in consideration of effects of refraction and reflection caused by the plurality of layers formed in the sample model, and fitting the X-ray scattering intensity calculated based on the sample model to the measured scattering intensity;

a determining unit for determining optimum values of parameters for specifying a shape of the unit structure based on a fitting result of the fitting unit; and an output unit for outputting, as an output value, at least a part of an analysis value containing the optimum values of the parameters for specifying the shape of the unit structure to the second inspection device according to a predetermined protocol, and the second inspection device inspects the microstructure on the surface of the semiconductor wafer by using the output value from the first inspection device.

3. The hybrid inspection system according to claim 2, wherein the second inspection device comprises an optical inspection device.

4. The hybrid inspection system according to claim 2, wherein the second inspection device comprises an inspection device using a scanning electron microscope.

5. The hybrid inspection system according to claim 2, wherein a pitch of the periodic structure in the sample model is contained as the analysis value to be outputted from the first inspection device.

6. The hybrid inspection device according to claim 2, wherein when the periodic structure in the sample model includes a hole repeating structure, a hole diameter is contained as the analysis value to be outputted from the first inspection device.

7. The hybrid inspection device according to claim 1, wherein the first inspection device includes:

a measuring unit for irradiating the surface of the semiconductor wafer with X-rays and measuring scattering intensity;

a fitting unit for assuming a sample model having a microstructure on the surface of the semiconductor wafer, the microstructure forming one or a plurality of layers in a direction vertical to the surface and constituting a periodic structure in which a unit structure is periodically arranged in a direction parallel to the surface in the layers, the unit structure further has a positional fluctuation from a strict periodical position thereof, and the positional fluctuation is random without being dependent on a mutual positional difference, the unit structure being formed by a uniform real region and a spatial region in the layers, calculating scattering intensity of X-rays generated by the real region, and fitting the X-ray scattering intensity calculated based on the sample model to the measured scattering intensity;

a determining unit for determining optimum values of parameters for specifying a shape of the unit structure based on a fitting result of the fitting unit; and an output unit for outputting, as an output value, at least a part of an analysis value containing the optimum values of the parameters for specifying the shape of the unit structure to the second inspection device according to a predetermined protocol, and the second inspection device inspects the microstructure on the surface of the semiconductor wafer by using the output value from the first inspection device.

8. The hybrid inspection system according to claim 1, wherein the first inspection device includes:

a sample stage for placing a semiconductor wafer as an inspection target thereon;

an image observing unit for observing an image of a microstructure on a surface of the semiconductor wafer placed on the sample stage:

a positioning mechanism that is controlled based on an image observation result of the microstructure on the surface of the semiconductor wafer by the image observing unit, and moves the sample stage in two orthogonal directions on a horizontal plane, a height direction and an in-plane rotation direction;

a goniometer containing first and second rotation members each of which rotates independently along a virtual plane vertical to the surface of the semiconductor wafer placed on the sample stage around a rotation axis contained in the same plane as the surface of the semiconductor wafer;

an X-ray irradiation unit that is installed in the first rotation member;

an X-ray detector installed in the second rotation member; and an analysis unit for quantizing and analyzing an X-ray pattern detected by the X-ray detector, wherein the sample stage and the positioning mechanism are formed of materials having small X-ray absorption coefficients through which X-rays can be transmitted, or are configured to become hollow, the first rotation member is configured to be rotatable from a horizontal position to a position below the sample stage, the X-ray irradiation unit is configured to irradiate the surface of the semiconductor wafer placed on an upper surface of the sample stage with X-rays in a direction perpendicular to the surface of the semiconductor wafer from a lower side of the surface of the semiconductor wafer, the positioning mechanism is configured to rotate the semiconductor wafer in-plane, and the X-ray detector is configured to detect scattered X-rays transmitted through the surface of the semiconductor wafer.

9. The hybrid inspection system according to claim 8, wherein the first inspection device measures scattered X-rays from the surface of the semiconductor wafer by the X-ray detector.

10. The hybrid inspection system according to claim 8, wherein the first inspection device includes a two-dimensional X-ray detector as the X-ray detector.

11. The hybrid inspection system according to claim 1, wherein the second inspection device is configured to verify an inspection result by using the X-ray measurement data obtained by the first inspection device or the analysis result of the X-ray measurement data.

12. The hybrid inspection system according to claim 11, wherein an inspection device using a scanning electron microscope is applied to the second inspection device, a part having a microstructure on the surface of the semiconductor wafer is measured by the first inspection device while the same part having the microstructure on the surface of the semiconductor wafer is measured by the second inspection device, thereby acquiring a line profile, and thus-obtained two measurement data are collated with each other to verify the line profile obtained by the second inspection device and define a CD value.

13. The hybrid inspection system according to claim 1, wherein an optical inspection device is applied to the second inspection device; when measurement data of the second inspection device shows an abnormal value, the measurement data is compared with measurement data of the first inspection device; and when the measurement data of the first inspection device is normal, the measurement data of the second inspection device is treated as an abnormal value caused by disturbance, but when the measurement data of the first inspection device also shows an abnormal value, the measurement data of the second inspection device is treated as shape abnormality of an inspection target.

14. The hybrid inspection system according to claim 1, wherein the first inspection device comprises a sample stage on which the semiconductor wafer is placed, a positioning mechanism for driving the semiconductor wafer placed on the sample stage, an optical microscope for capturing an image of the surface of the semiconductor wafer placed on the sample stage, an image recognition circuit for recognizing the image of the surface of the semiconductor wafer captured by the optical microscope, and a storage unit, the storage unit stores a unique point on the surface of the semiconductor wafer which can be specified based on image information from the optical microscope by the image recognition circuit, and position information of a site-under-measurement preset based on the unique point, the image recognition circuit recognizes the unique point based on the image information from the optical microscope with respect to the surface of the semiconductor wafer placed on the sample stage, based on the position information of the site-under-measurement preset based on the recognized unique point, the site-under-measurement of the semiconductor wafer is arranged at an inspection position to perform an X-ray inspection, and the second inspection device is an inspection device for non-destructively measuring on an in-line basis in a semiconductor manufacturing process.

15. A hybrid inspection system including a first inspection device for inspecting a microstructure on a surface of a semiconductor wafer based on X-ray measurement data obtained by irradiating the surface of the semiconductor wafer with X-rays, and a second inspection device for inspecting the microstructure on the surface of the semiconductor wafer by a measuring method using no X-rays, wherein the first inspection device is an X-ray nano shape measuring apparatus using X-ray small angle scattering, one of measurement data obtained by the second inspection device and an analysis result of the measurement data is output to the first inspection device, and the first inspection device inspects the microstructure on the surface of the semiconductor wafer by using one of the measurement data obtained by the second inspection device and the analysis result of the measurement data.

16. The hybrid inspection system according to claim 15, wherein the first inspection device is configured to verify an inspection result by using the X-ray measurement data obtained by the second inspection device or the analysis result of the X-ray measurement data.

17. The hybrid inspection system according to claim 15, wherein an inspection device using a scanning electron microscope is applied to the second inspection device, an observation image of the microstructure on the surface of the semiconductor wafer is obtained by the second inspection device, a shape model of the microstructure on the surface of the semiconductor wafer is specified by the first inspection device, the observation image of the second inspection device is fitted with the shape model of the first inspection device, a contour position of a pattern shape formed on the semiconductor wafer as a measurement target is estimated by using the shape model, and measurement by the first inspection device and data analysis of a result of the measurement are performed based on the estimated contour position.

18. A hybrid inspection system including a first inspection device for inspecting a microstructure on a surface of a semiconductor wafer based on X-ray measurement data obtained by irradiating the surface of the semiconductor wafer with X-rays, a second inspection device for inspecting the microstructure on the surface of the semiconductor wafer by a measuring method using no X-rays, and an analysis server to which the first inspection device and the second inspection device are connected, and a host computer for performing process control in a semiconductor factory, wherein the first inspection device is an X-ray nano shape measuring apparatus using X-ray small angle scattering, and includes:

a measuring unit for irradiating the surface of the semiconductor wafer with X-rays and measuring scattering intensity;

a fitting unit for assuming a sample model having a microstructure on the surface of the semiconductor wafer, the microstructure forming a plurality of layers having different refractive indexes in a direction vertical to the surface, and constituting a periodic structure in which a unit structure is periodically arranged in a direction parallel to the surface in the layers, calculating scattering intensity of X-rays scattered by the microstructure in consideration of effects of refraction and reflection caused by the plurality of layers formed in the sample model, and fitting the X-ray scattering intensity calculated based on the sample model to the measured scattering intensity;

a determining unit for determining optimum values of parameters for specifying a shape of the unit structure based on a fitting result of the fitting unit; and an output unit for outputting, as an output value, at least a part of an analysis value containing the optimum values of the parameters for specifying the shape of the unit structure, wherein one of X-ray measurement data obtained by the first inspection device and an analysis result of the X-ray measurement data, and one of data obtained by the second inspection device and an analysis result of the data are output to the analysis server according to a standardization protocol of the semiconductor factory, and the analysis server uses the analysis result of one of the first inspection device and the second inspection device to analyze the microstructure on the surface of the semiconductor wafer based on the measurement data of one of the first inspection device and the second inspection device.

\* \* \* \* \*